(12) United States Patent
Goeke

(10) Patent No.: US 10,412,477 B2
(45) Date of Patent: Sep. 10, 2019

(54) HIGH FIDELITY, PROFESSIONAL GRADE MICROPHONE SYSTEM FOR DIRECT COUPLING TO RECORDING COMPONENTS

(71) Applicant: Wade Goeke, Shell Rock, IA (US)

(72) Inventor: Wade Goeke, Shell Rock, IA (US)

( * ) Notice: Subject to any disclaimer, the term of this patent is extended or adjusted under 35 U.S.C. 154(b) by 0 days.

(21) Appl. No.: 15/708,954

(22) Filed: Sep. 19, 2017

(65) Prior Publication Data
US 2018/0084325 A1    Mar. 22, 2018

Related U.S. Application Data

(60) Provisional application No. 62/396,630, filed on Sep. 19, 2016.

(51) Int. Cl.
*H04R 1/04* (2006.01)
*H03G 3/06* (2006.01)
(Continued)

(52) U.S. Cl.
CPC ............. *H04R 1/04* (2013.01); *H03G 3/06* (2013.01); *H03G 3/10* (2013.01); *H03G 7/004* (2013.01);
(Continued)

(58) Field of Classification Search
CPC ... H04R 1/04; H04R 1/08; H04R 3/00; H03G 3/06; H03G 3/10; H03G 7/004; H03G 9/04; H03G 9/14
(Continued)

(56) References Cited

U.S. PATENT DOCUMENTS

| | | | |
|---|---|---|---|
| 3,011,025 A | * | 11/1961 | Sullivan .................... H03F 3/22 330/117 |
| 3,336,441 A | | 8/1967 | Görike |

(Continued)

FOREIGN PATENT DOCUMENTS

GB    2488182 B    1/2013

OTHER PUBLICATIONS

Re, Electro_Voice Model RE34, 1983, p. 1-16.*
(Continued)

*Primary Examiner* — William A Jerez Lora
(74) *Attorney, Agent, or Firm* — McKee, Voorhees & Sease, PLC

(57) ABSTRACT

Current microphone designs are still using concepts developed in the early 20th century. A transducer followed by a simple buffer with high impedance, low power, and low gain. Even when tubes were replaced by solid state devices the same practice continued, with the low gain triode being replaced by an even smaller power, lower current FET buffer. The invention offers a microphone system intended for professional audio applications that dispenses with these, low power concepts and incorporates elements of a microphone, microphone pre amplifier, and high power mixing console/pre amp line drivers into a single housing. By combining transducer, high fidelity pre amp circuit, and high power line driving stage with a high voltage, high current external power supply, the capabilities of microphones can be greatly increased in many ways. Our approach can be implemented in a variety of circuit topologies including discrete transistors, tubes and integrated circuits, our concept allows microphones to connect directly to analog or digital recording devices without the need for external mixers or pre amplifiers. The design not only allows for unprecedented simplicity in the work flow of the modern (Continued)

recording studio, which combines the use of stand-alone analog records, standalone digital recorder, and computer workstation based recording options, but also eliminates redundant circuits that are present in microphones, microphone pre amps, and mixing consoles, while offering the customer increased value.

20 Claims, 21 Drawing Sheets

(51) Int. Cl.
  *H03G 3/10* (2006.01)
  *H03G 7/00* (2006.01)
  *H03G 9/04* (2006.01)
  *H03G 9/14* (2006.01)
  *H04R 3/00* (2006.01)
  *H04R 1/08* (2006.01)
(52) U.S. Cl.
  CPC ............... *H03G 9/04* (2013.01); *H03G 9/14* (2013.01); *H04R 1/08* (2013.01); *H04R 3/00* (2013.01)
(58) Field of Classification Search
  USPC ......... 381/109, 111, 118, 119, 120, 122, 124
  See application file for complete search history.

(56) References Cited

U.S. PATENT DOCUMENTS

| | | | |
|---|---|---|---|
| 4,012,604 A | 3/1977 | Speidel | |
| 4,536,888 A | 8/1985 | Wilson | |
| 4,541,112 A | 9/1985 | Kern | |
| 4,737,735 A | 4/1988 | Kampes | |
| 6,275,112 B1* | 8/2001 | Muza | H03F 1/301 330/296 |
| 6,914,992 B1 | 7/2005 | van Halteren et al. | |
| 7,706,559 B2 | 4/2010 | Collins | |
| 8,265,304 B2 | 9/2012 | Osborne | |
| 2002/0085726 A1* | 7/2002 | Fuqua | H04S 3/00 381/111 |
| 2002/0125949 A1 | 9/2002 | Stenberg | |
| 2005/0213787 A1 | 9/2005 | Collins | |
| 2006/0078152 A1 | 4/2006 | Royer et al. | |
| 2006/0147060 A1 | 7/2006 | Shyu et al. | |
| 2010/0296670 A1* | 11/2010 | Akino | H04R 3/00 381/111 |
| 2011/0182442 A1 | 7/2011 | McDonald et al. | |
| 2011/0311083 A1 | 12/2011 | Bennett | |
| 2012/0308052 A1 | 12/2012 | Agarwal et al. | |
| 2012/0321111 A1 | 12/2012 | Lillelund | |
| 2013/0129117 A1 | 5/2013 | Thomsen et al. | |
| 2015/0087991 A1* | 3/2015 | Chen | G01S 7/5202 600/459 |
| 2016/0305805 A1* | 10/2016 | Baumoel | G01F 1/663 |

OTHER PUBLICATIONS

RE, Electro Voice Model, 1983.*
NJM, NJM2783, 2009.*
Angelfire, Using the Pentode_Triode Tube as the Amplifier, 2016.*
Anonymous: "Electro-Voice RE34 Cardioid Line/Mic Level Condenser Microphone Specifications", Dec. 31, 1983,XP055424811, Retrieved from the Internet: URL:https://data2.manualslib.com/pdf/5/436/43547-electrovoice/re34.pdf?bd867fb0c9cc6a10fed533cf85bd638d&take=binary, retrieved on Nov. 14, 2017.
Neumann: "Condenser microphone U67 with integrated tube pre-amplifier", Mar. 31, 1966, XP055425683, Retrieved from the Internet: URL:https://www.neumann.com/?lang=en&id=hist_microphones&cid=u67 publications, retrieved on Nov. 16, 2017.
European Patent Office, PCT/US2017/052240, "The International Search Report and the Written Opinion of the International Searching Authority," dated Nov. 24, 2017.
Chandler Limited, Inc., PCT/US2017/052240, "Written Opinion of the International Preliminary Examining Authority", filed Sep. 19, 2017,18 pages, dated Sep. 6, 2018.

* cited by examiner

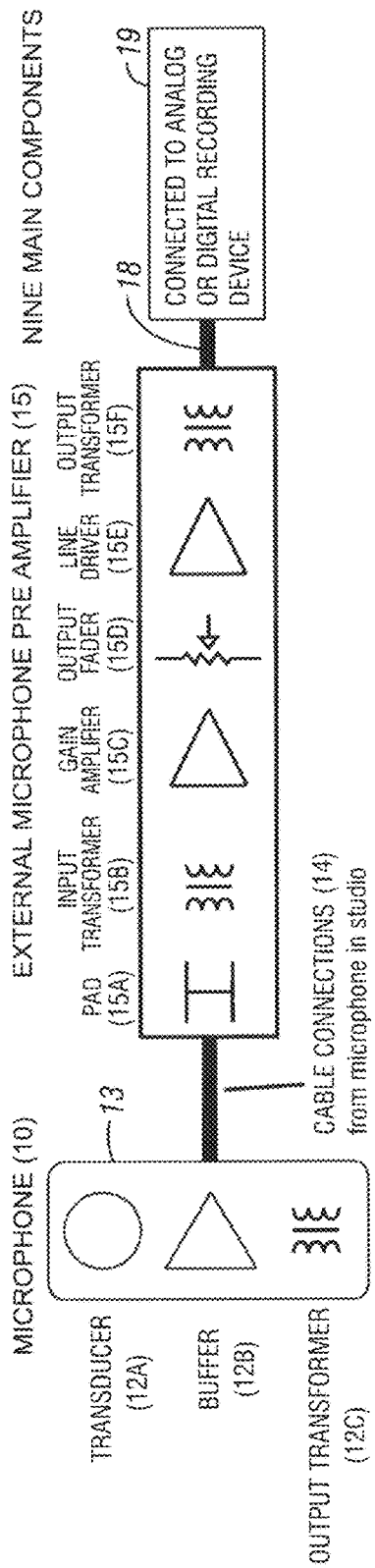
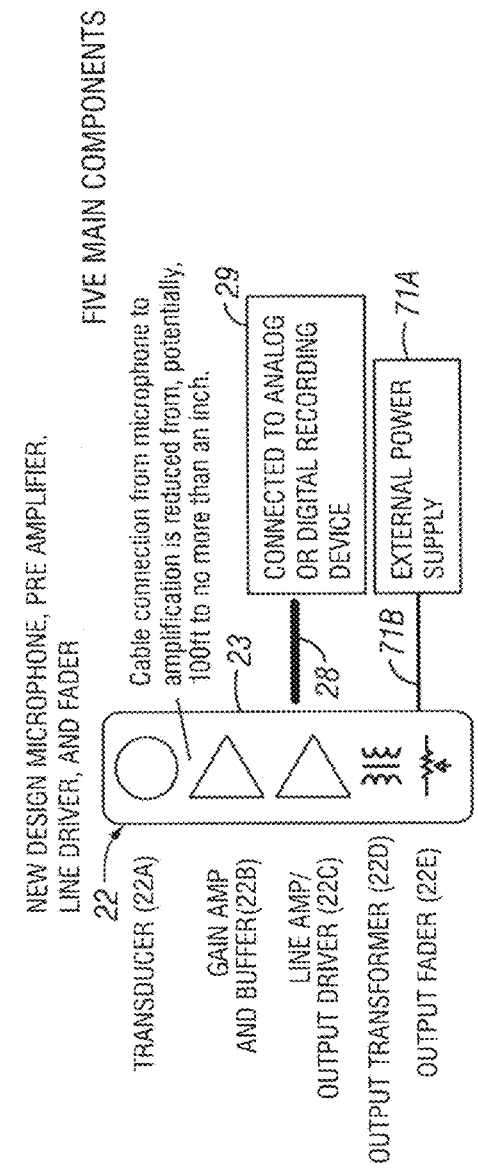
FIG. 1A (PRIOR ART)
FIG. 2A

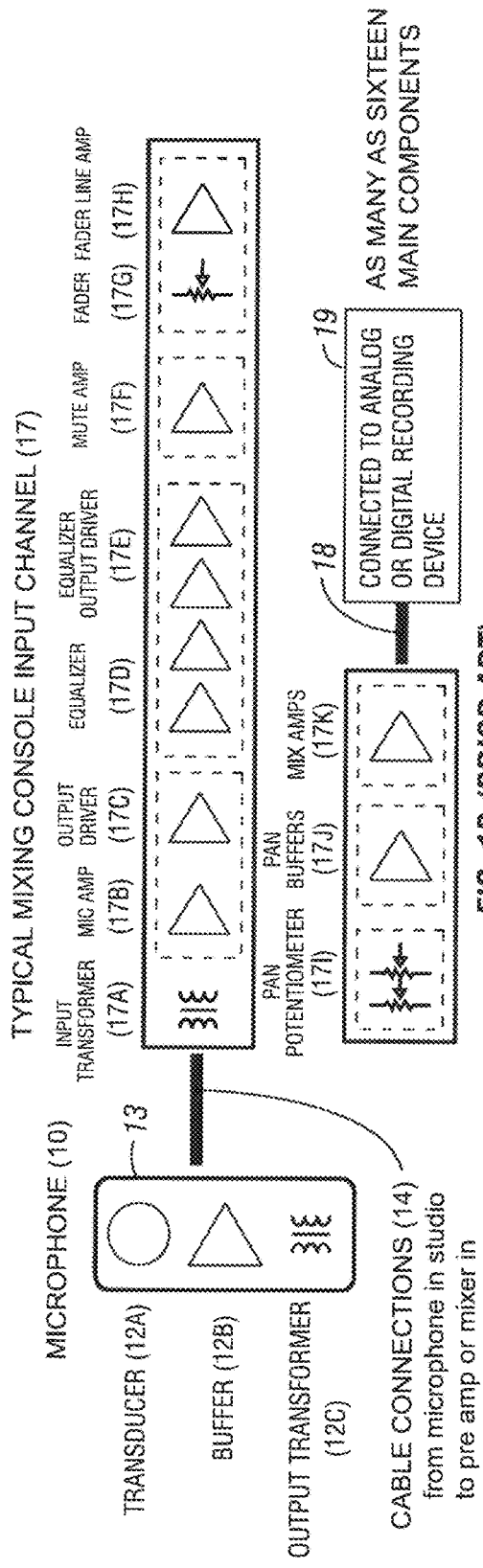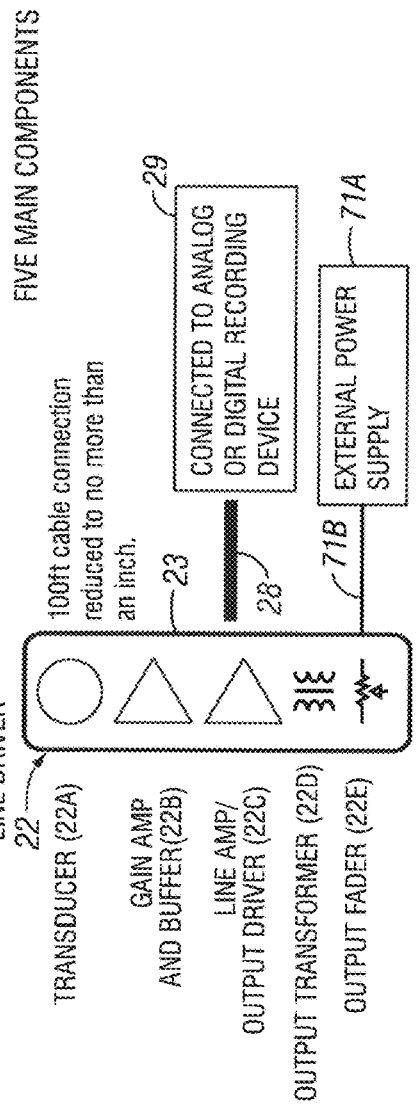
FIG. 1B (PRIOR ART)
FIG. 2B

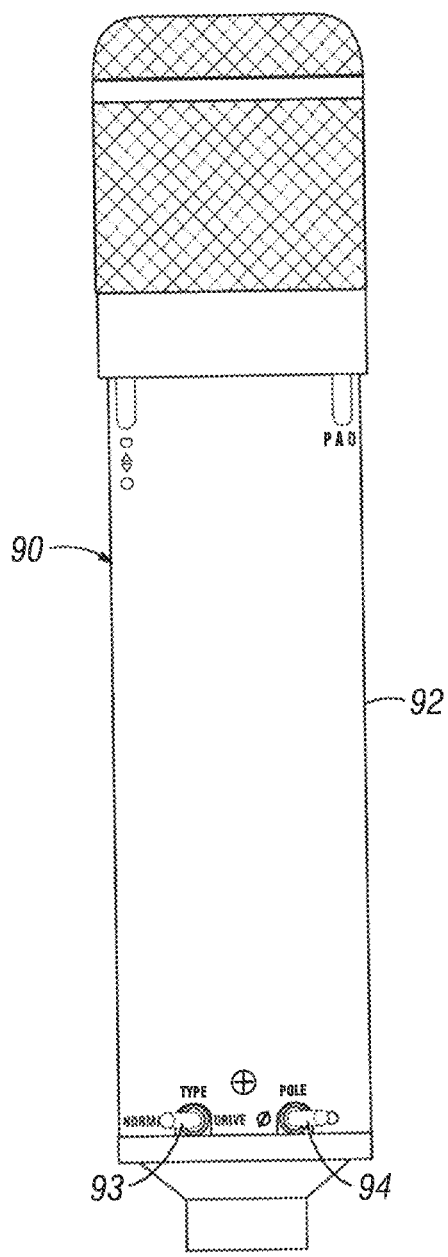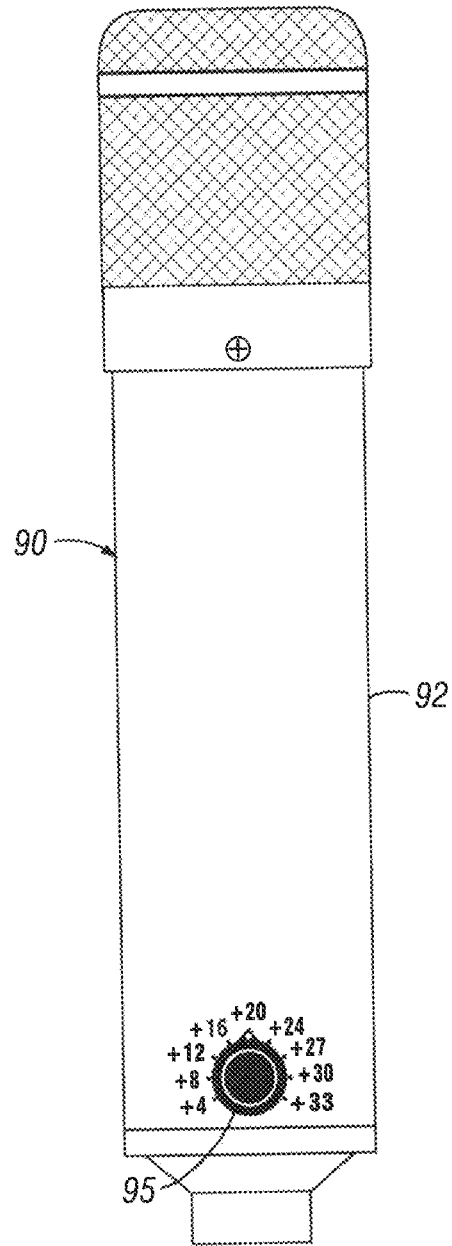
*FIG. 9A*                    *FIG. 9B*

○ CARDIOID

○ OMNI

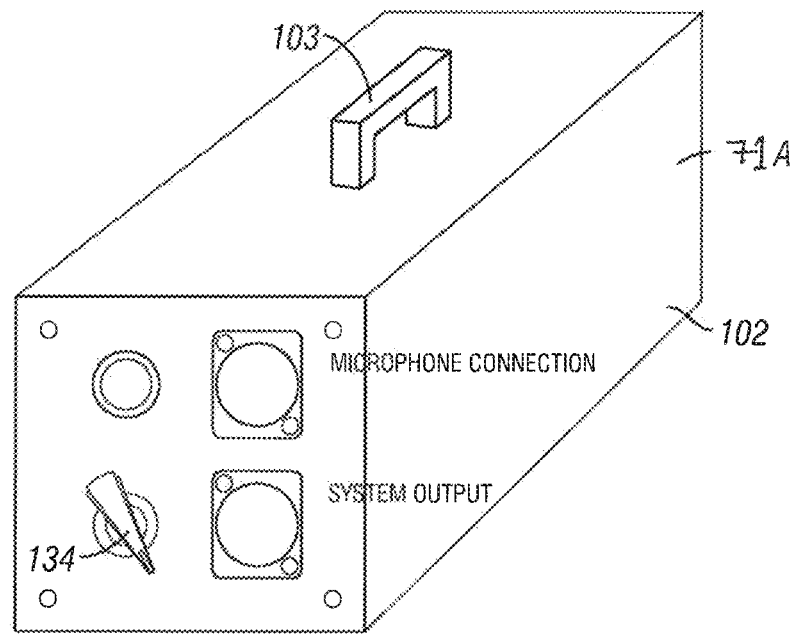
FIG. 10A
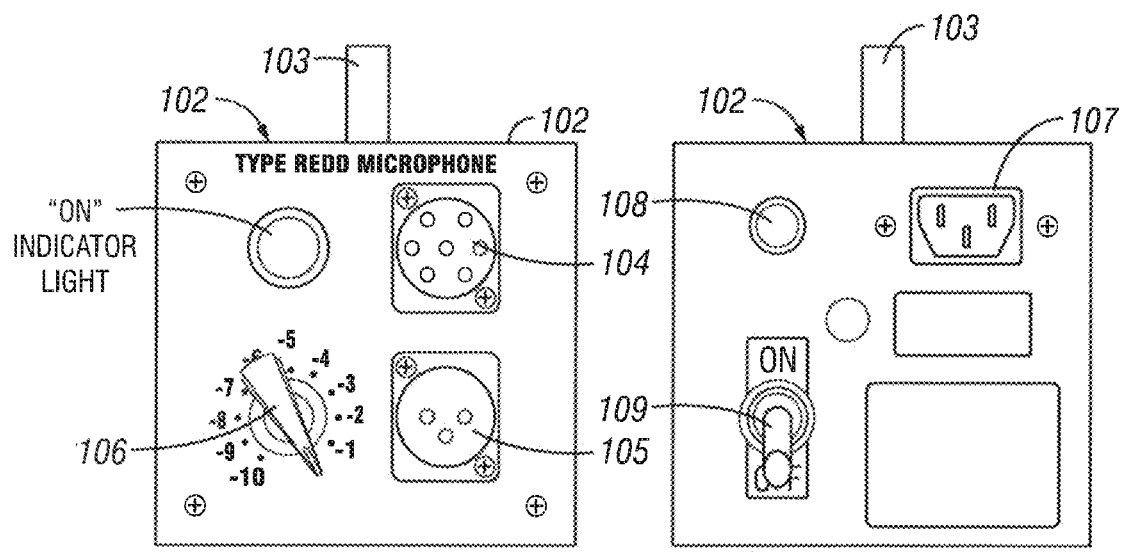
FIG. 10B   FIG. 10C

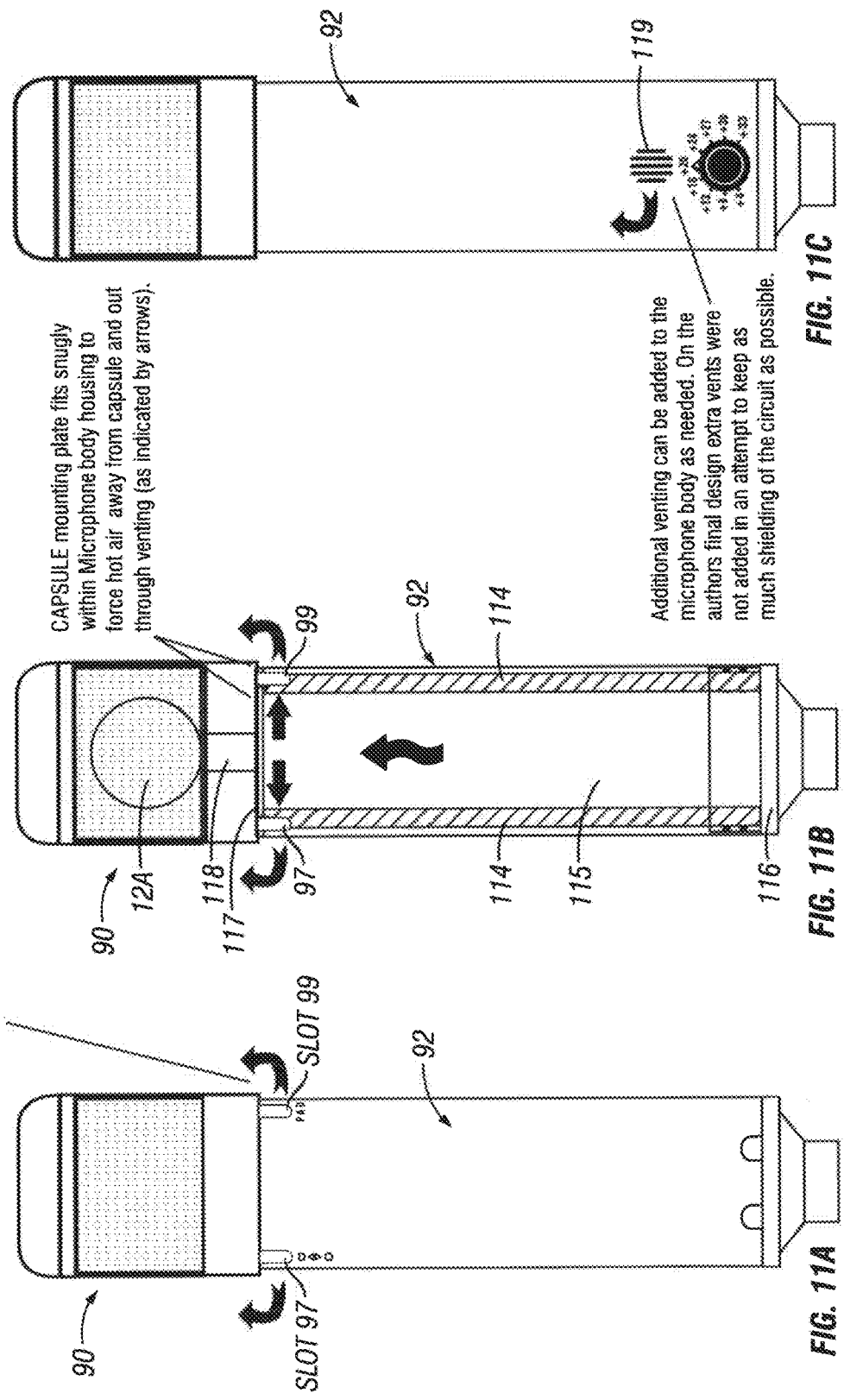

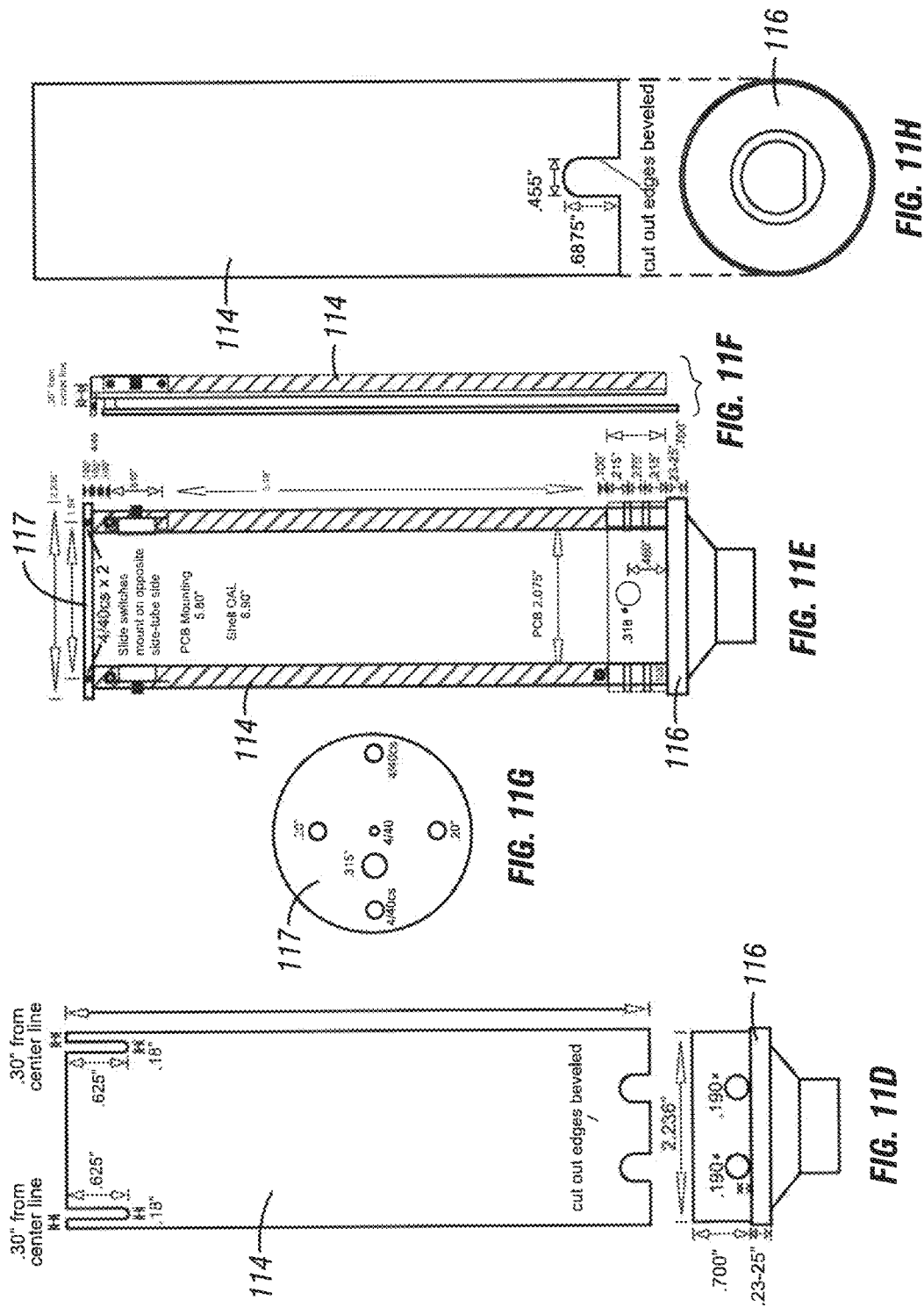

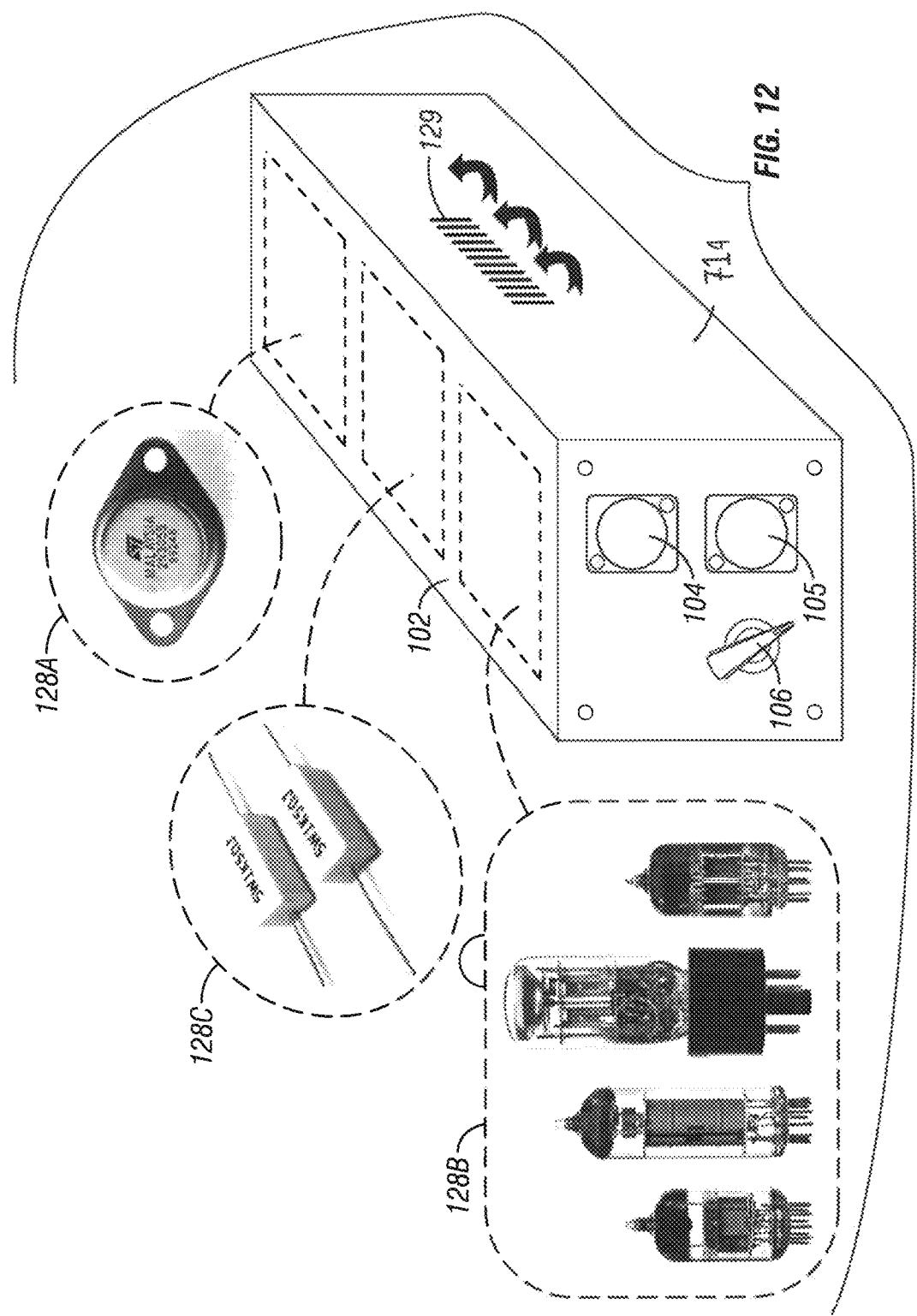

TRANSDUCERS AND ELEMENTS for NEW SYSTEM
It is important to not that microphones can be built with a variety of transducer types. The most common being Condenser, Ribbon, Dynamic, and Ribbon. The New Sysyem can easily be implemeted with any of these variations by a designer knowledgable in the carft, just as various various types of circuit topology have been shown.

Each of these are available in various sizes, and tpes with variations in construction and material that can be manipulated to achieve the designers desired effect.

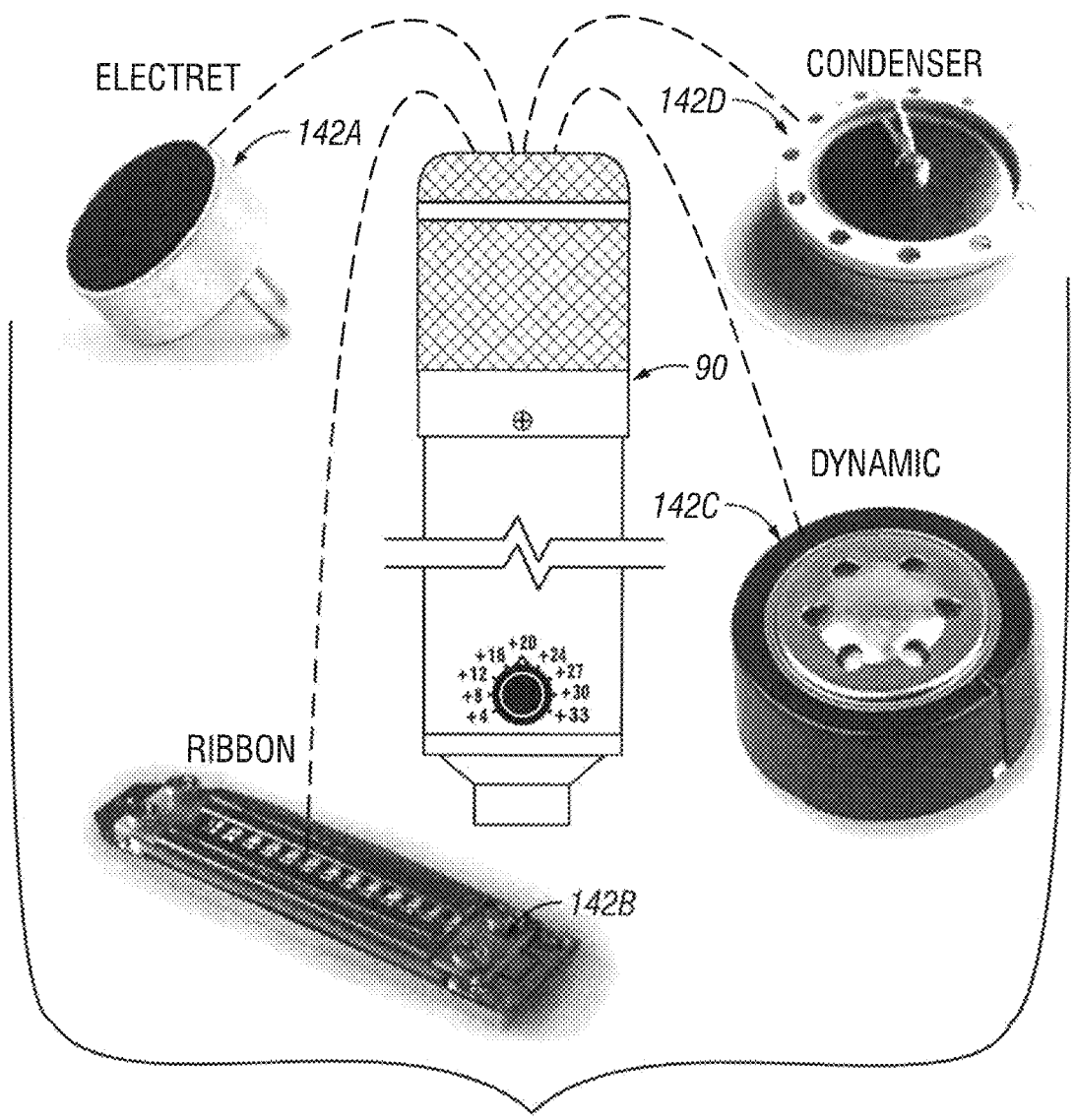

FIG. 14

HIGH FIDELITY, PROFESSIONAL GRADE MICROPHONE SYSTEM FOR DIRECT COUPLING TO RECORDING COMPONENTS

CROSS-REFERENCE TO RELATED APPLICATIONS

This application claims the benefit of Provisional Application U.S. Ser. No. 62/396,630 filed on Sep. 19, 2016, all of which is herein incorporated by reference in its entirety.

I. BACKGROUND OF THE INVENTION

A. Field of the Invention

The present invention relates to microphones and, in particular, high fidelity microphones such as used in professional audio settings.

Current microphone designs are still using concepts developed in the early 20th century; a transducer followed by a simple buffer with high impedance, low power, and low gain. Even when tubes were replaced by solid state devices the same practice continued, with the low gain triode being replaced by an even smaller power, lower current FET buffer.

The invention relates to a microphone system intended for professional audio applications that dispenses with these low power concepts and incorporates elements of a microphone, microphone pre amplifier, and high power mixing console/pre amp line drivers into a single housing. By combining transducer, high fidelity pre amp circuit, and high power line driving stage with a high voltage, high current external power supply, the capabilities of microphones can be greatly increased in many ways. Our approach can be implemented in a variety of circuit topologies including discrete transistors, tubes, and integrated circuits. Our concept allows microphones to connect directly to analog or digital recording devices without the need for external mixers or pre amplifiers. The design not only allows for unprecedented simplicity in the work flow of the modern recording studio, which combines the use of stand-alone analog recorder, stand-alone digital recorder, and computer workstation based recording options, but also eliminates redundant circuits that are present in microphones, microphone pre amps, and mixing consoles, while offering the customer increased value.

B. Problems in the State of the Art

In a standard recording studio or live sound situation, a low level microphone signal would be sent down cable connections as long as 100 ft. or more. In the case of live sound, it could be 100s of feet. They would then be routed through patch panels and sent to pre amplifiers. Long signal lines at low level can degrade audio quality and introduce noise. Our concept shortens the signal path to amplification from potentially 100s of feet to mere inches, and sometimes at or near just 1 inch.

Normally a recording would be made one of two ways in a professional environment:

1) with a mixing console where the source is mic'ed and fed to a mixing console and the microphone is powered with low current 48 volt power (that can only power a couple small signal transistors), the low level microphone signal is amplified (a standard microphone itself does not provide enough power or amplification to be used on its own), a line amplifier drives the signal, a fader allows over volume control, and is then routed to a computer or tape machine and recorded.

2) a low level microphone is connected to an external pre amplifier which provides gain, line driver, and overall volume control and then can be routed to a tape machine, digital recorder, or other auxiliary equipment such as high quality analog audio compression (a mainstay of recording studios).

By "professional quality" it is meant on the level or at or near the top level of what some in the art call "professional audio". The term "professional audio" has no precise definition, but typically includes such things as: (a) operations carried out by trained audio engineers; (b) the capturing of sound with one or more microphones; (c) balancing, mixing and adjusting sound signals from multitrack recording devices using a mixing console; (d) the control of audio levels using standardized types of metering; (e) sound signals passing through lengthy signal chains involving processes at different times and places, involving a variety of skills, and (f) compliance with organizational, national and international practices and standards established by such bodies as the International Telecommunications Union, Audio Engineering Society and European Broadcasting Union.

The term "professional audio" refers to both an activity and a type of high quality audio equipment. Typical activities can include sound recording, sound reinforcement system setup and mixing, and studio music production by trained sound engineers, audio engineers, and audio technicians who work in live event support, using audio mixers or sound reinforcement systems. In contrast, consumer or "bedroom quality" audio equipment is usually confined to the reproduction of sound in a private home on a home stereo or home cinema system.

Professional audio can include but is not limited to broadcast radio, audio mastering in a recording studio, television studio, and sound reinforcement such as a live concert, DJ performances, and audio sampling.

Thus, lower audio quality levels, including "bedroom" or "home" quality, neither include the demands or criteria of "professional audio". As is well appreciated by those skilled in the art of professional quality audio, the difference from lower quality can be extremely important.

There are also different parameters and factors involved in professional audio applications in contrast with home audio. In professional audio, the goal is to, with high fidelity, reproduce the transduced sound. This can be reproduction in the sense for then playing the sound for listening live or in the sense of recording the sound for recalling it and listening to it at a later time or preserving the live sound, or for mixing it with other sound or further processing it as in producing recordings. Sometimes it is referred to as live and recorded audio engineering.

By "high fidelity" it is meant that sound reproduction has minimal amounts of noise and distortion, and an accurate frequency response. Professional audio engineers work on the recording, including but not limited to manipulation using equalization and electronic effects, mixing, reproduction, and reinforcement of sound. This typically also requires technical aspects such as placing of microphones, adjusting pre-amp knobs or controls, and setting of levels. This usually involves using an audio console and sound reinforcement system.

Presently a variety of sound reproduction or recording techniques are used. One is analog. Another is digital. Professional audio equipment tends to have specific and special standards and components. One example is special professional audio connectors (e.g. XLR). Some microphones, such as condenser microphones, require power. An alternative to battery power is phantom power, which consists of direct current applied equally through the two signal lines of a balanced audio connector, usually a three-pin XLR connector. The supply voltage is referenced to the ground pin of the connector (pin 1 of an XLR), which normally is connected to the cable shield or a ground wire in the cable or both. Phantom power is usually supplied at a nominal 48 volts DC, although lower voltages are permissible and modern microphones will often operate over a wide range. It is common for modern mixers to have a built-in switch-operated 48-volt power supply which supplies all mic inputs with phantom power, thus eliminating the need for bulky external supplies on individual mics.

FIGS. 1A and 2A diagrammatically illustrate two paradigms under the current state of the art. FIG. 1A uses a microphone 10 that houses in a mic body 13 a transducer/capsule 12A, low gain buffer 12B, and output transformer 12C. Its cable 14 plugs into an external mic pre amp 15, which in turn plugs (via cable/connector 18) into an analog or digital recorder 19. Note that the low output power mic signal must travel sometimes long, signal-degrading distances to even reach the pre-amp 15. The pre amp 15 has additional transformers and gain amplifiers (15A-F). FIG. 1B uses the same state of the art low output signal mic 10 but plugged into a state of the art mixing console 17. Similarly, sometimes long, signal-degrading distances exist between mic 10 and console 17, the console includes additional transformers and amplifiers (17A-K), as well as other functional components) before then plugging into the analog or digital recorder 19. However, note the following.

Requirements for professional audio differ greatly differ from those of hearing aids, computers, and USB microphones.

In many studio environments signal path is overly complex and redundant. All these circuits could be present in a studio using a mixer as its center piece but still using external pre amps (one of today's most common practices):
 a) transducer,
 b) microphone buffer,
 c) microphone output transformer,
 d) pre amp input transformer,
 e) amplifier of pre amp,
 f) amplifier of line driver,
 g) preamp output transformer,
 h) mixer input transformer,
 i) mixer input amplifier,
 j) equalizer amplifiers,
 k) channel buffers for faders,
 l) channel output amplifiers,
 m) summing/mixing amplifiers,
 n) mixer output amplifiers and
 o) even more.

In the above cases, it could beneficial if signal path could be shortened to transducer, microphone amplifier, microphone line driver, and output transformer.

Also, with primary concerns in a recording studio being sound quality, a reduction in components could result in the best translation of the original sound source to the final recording.

However, how to implement such things is not trivial. As appreciated by those skilled in the art, there are a variety of different and sometimes competing or antagonistic factors in design and implementation of professional audio components. This is true of microphones.

One example is form factor. While it might be beneficial to add components to a mic housing, practical considerations of size and interior space must be considered. It would be doubtfully practical to have a mic housing that could not be hand-held. There are also aesthetic considerations. Beyond size, shape and ornamentation can be important to at least some of the interested parties using mics in a professional setting.

Another example is compatibility. Moving to a new paradigm for high fidelity mics requires the designer to understand and integrate both form and function of components in the mic housing, as well as needed interfaces outside the housing. As is understood by those skilled in the art, this can involve a plurality of sometimes subtle factors that may not allow of predictable results. For example, if most state-of-the-art external components are set up to supply no more than relatively low voltage, low current power (if any) to state-of-the-art mics, a change to higher voltage, higher current on-board the mic and still be able to interface with state-of-the-art components used in professional audio applications is not trivial or predictable. There are subtleties including but not limited to functionality, compatibility, and even safety.

Another example is flexibility of utilizations. Moving to a new paradigm for high fidelity mics that includes the flexibility to interface with a variety of different professional audio components is not trivial. For example, to allow the mic to interface with either an analog recording device or a digital recording device requires subtle considerations and adaptability (either by manual selection or automatically) for different input or operating requirements of those different components.

Another example is flexibility in the range of functional implementations of the invention. There are preferences or demands for different component make-ups of mics. Some users or designers prefer tube-based implementations. Others prefer solid state. To produce the benefits of the invention across these sometimes quite different component combinations is not trivial.

Therefore, there is room for improvement in this technical area.

II. SUMMARY OF INVENTION

Our new approach also translates to a large increase in value for the customer and encourages healthy competition to provide the user with quality tools for less cost, as a fractional number of components are needed. As an example, by using this approach in a studio where external pre amps are employed, the customer would no longer need to purchase both microphones and external pre amps. In a situation where an entire band is being recorded this would equal a massive savings, as the situation would potentially require many (e.g. twenty-four) microphones and external pre amps. This would be cut in half in this example with only twenty-four of our mic, pre amp, line driver combinations needed.

In a simpler studio without a mixer as its center piece (where all functions are handled within a computer workstation), signal path could still be cut in half. Going from transducer, microphone buffer, microphone output transformer, pre amp input transformer, amplifier of pre amp, amplifier of line driver, and output transformer to simply transducer, microphone amplifier, microphone line driver, microphone output transformer.

A. Objects, Features, and Advantages

A principle object, feature, aspect, or advantage of the present invention is methods, apparatus, and systems for a high fidelity microphone system that improve over or solves problems and deficiencies in the state of the art.

Further objects, features, aspects, or advantages of the present invention include methods, apparatus, and systems as above-described which provide for:

a. reduction in overall number of components needed for professional audio mic'ing set ups;
b. promotion of improved fidelity in transduced sound;
c. higher flexibility in application and interfacing with professional audio equipment;
d. reduction or elimination of redundancy in professional audio components and resulting economic benefits, including subtle but substantial reduction and economies when multiple mics are used;
e. retention of basic form factors for professional audio mics;
f. flexibility to build the mic in a variety of styles, specifically with different types of components (e.g. tube-based, semiconductor-based, solid state-based).

B. Aspects of the Invention

An aspect of the invention comprises a high fidelity, professional audio microphone assembly which facilitates direct connection to professional audio analog or digital recorders. A microphone housing includes with the microphone capsule a pre amp/buffer stage, a line driver stage, and an output stage. The pre amp/buffer stage is designed to provide matched, relatively high gain to the transduced sound from the capsule right at the microphone housing. The line driver stage produces sufficient gain at the microphone housing to support a high fidelity audio output signal to a recording machine whether a few or hundreds of feet away. The output stage can include, e.g., an output transformer and a fader, giving more local signal conditioning and control at the microphone housing. All this has to be balanced against providing necessary and sufficient electrical power to the mic assembly. In one embodiment, power for the on-board mic pre amp and line driver can be from an external dedicated power supply. Sometimes it might be possible to take power directly from a standard household electrical outlet. Electrical power such as might be needed to satisfy phantom power for certain types of mic capsules (e.g. condenser) can also be taken from that external power supply. The combination allows flexibility in use (e.g. different microphone capsules, different types of recording machines, different distances from the recording machine), as well as more on-board control at each microphone. In one alternative, the microphone assembly can also be configured to allow direct plug in to a conventional mixing console. This adds another level of flexibility.

In another aspect of the invention, a method of recording an audio event comprises concurrently using a plurality of microphone assemblies, as described immediately above. Use of the plural such microphones can save substantial resources because they obviate the need for external mic preamps and other redundant components that otherwise are included in conventional external mic pre amps or mixing consoles. The method provides the subtle benefits of flexibility in placement of the mics because cable distance to the mic is not a significant issue, reduction in capital costs, and on-board control.

In another aspect of the invention, a system comprises a recording set up for recording an audio event. The system comprises at least one microphone assembly as described above plugged into an analog or digital recorder or a mixing console, with mic pre amp and line driver stage power provided back to the microphone assembly.

III. BRIEF DESCRIPTION OF DRAWINGS

FIG. 1A is a diagrammatic depiction of one type of state of the art microphone.

FIG. 1B is a diagrammatic depiction of how the invention can differ from the state of the art paradigm of FIG. 1A.

FIG. 2A is a diagrammatic depiction of another type of state of the art microphone.

FIG. 2B is a diagrammatic depiction of how the invention can differ from the state of the art paradigm of FIG. 2A.

Figure 8A:
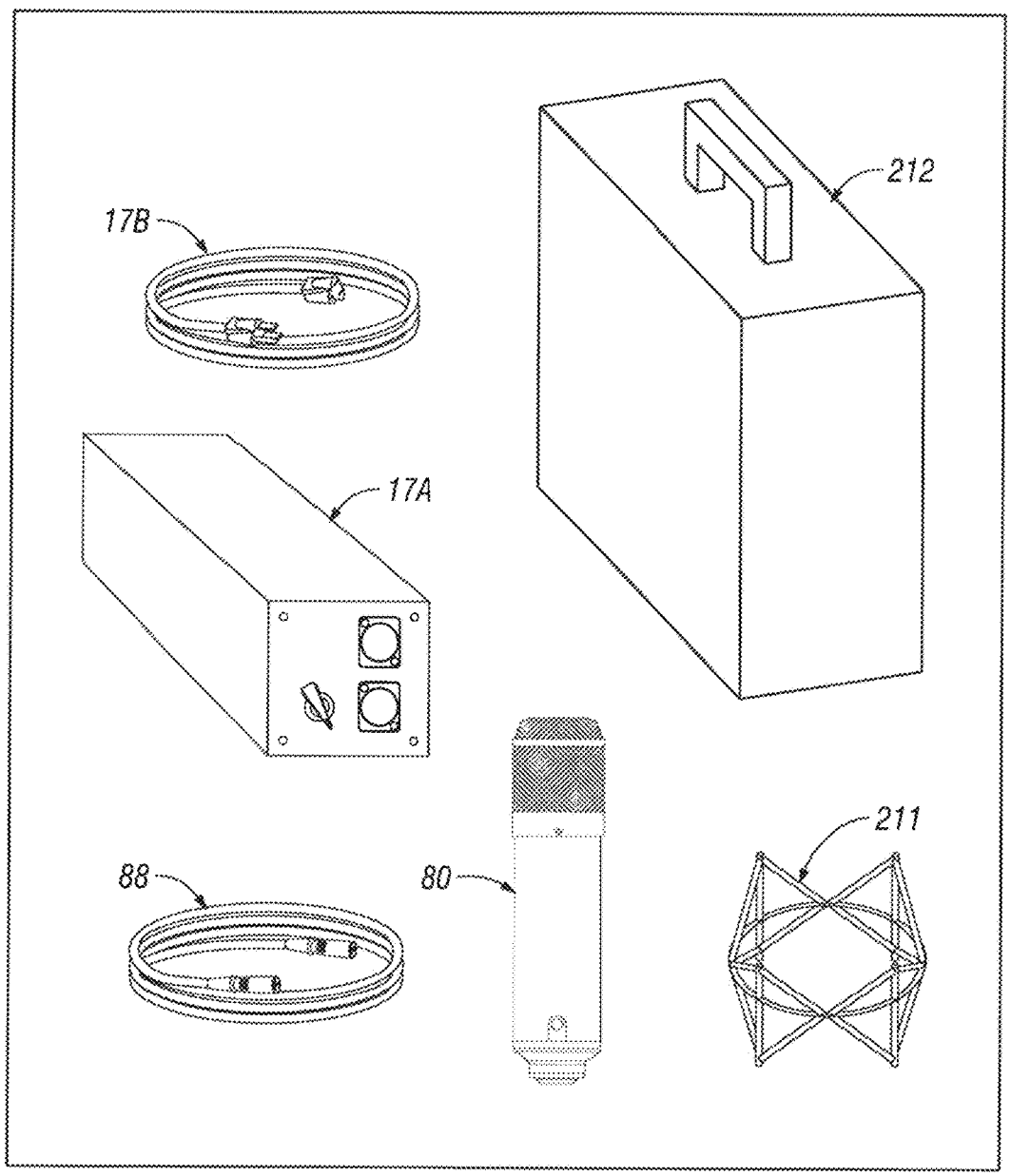
FIG. 8A is a depiction of one example of a kit according to the present invention, the kit including here a mic and cable for connection to a recording device, an external power supply and cable for the mic, and a carrying case. Optionally, a shock mount can be included in the kit.
Figure 8B:
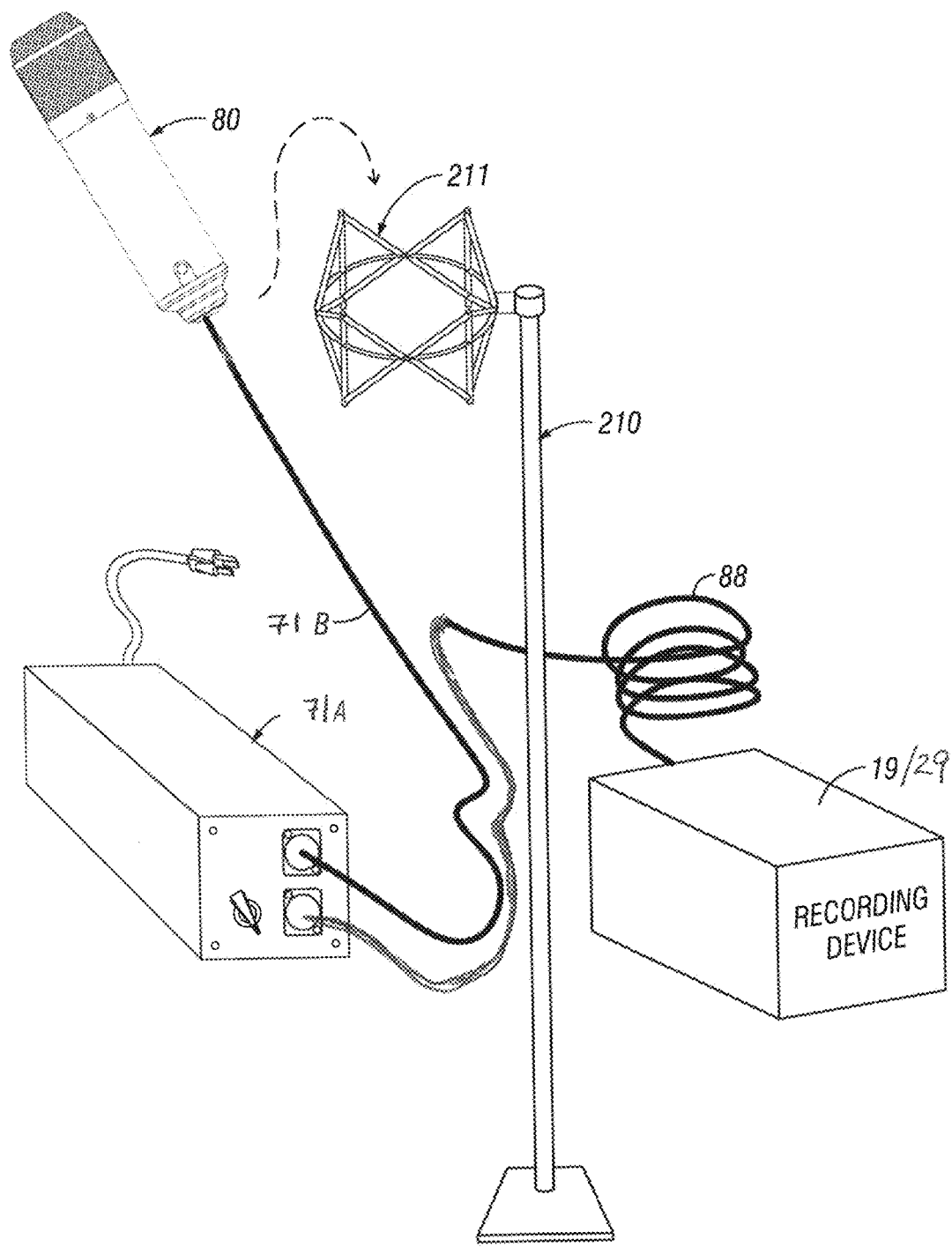
FIG. 8B shows the kit of FIG. 8A diagrammatically in operative configuration, including the mic removably mountable to a shock mount which is on a mic stand.
Figure 8C:
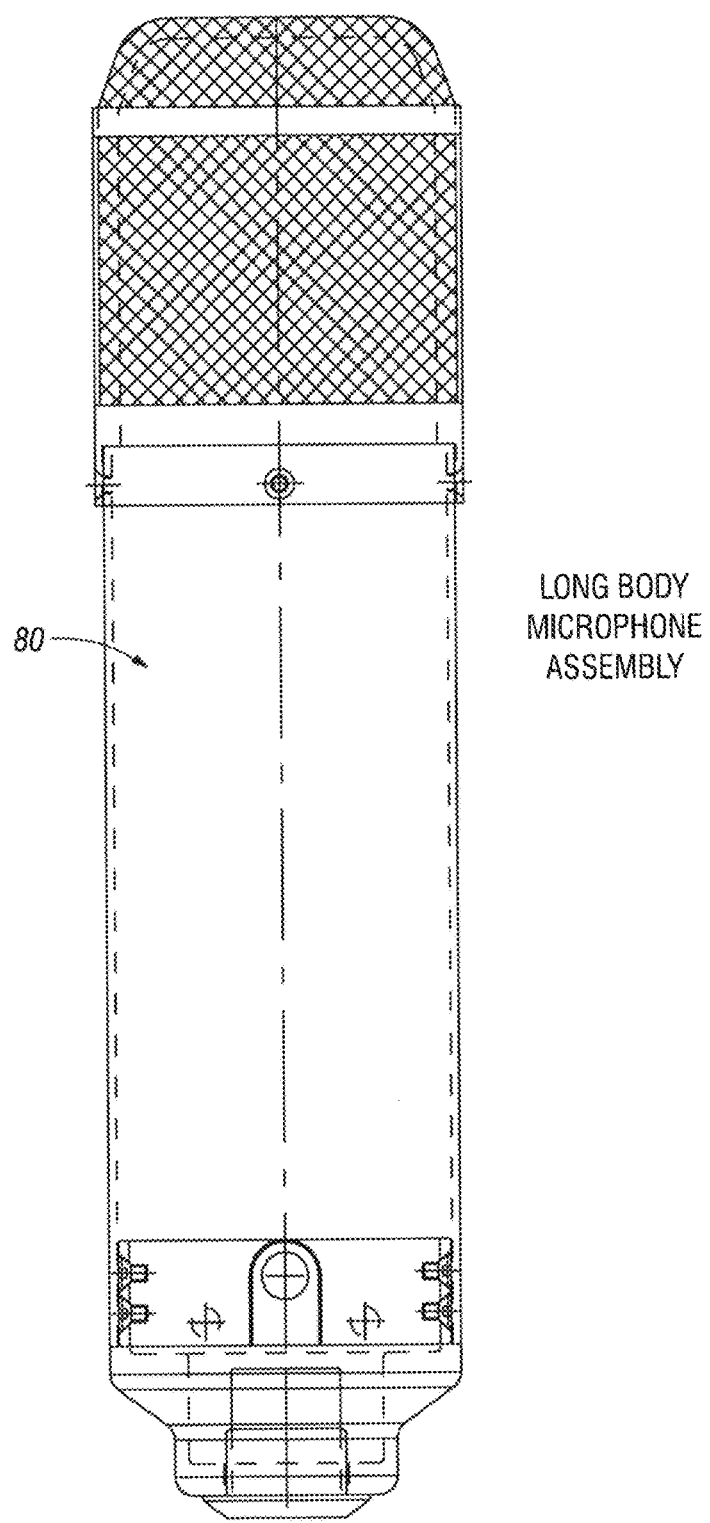
Figure 8D:
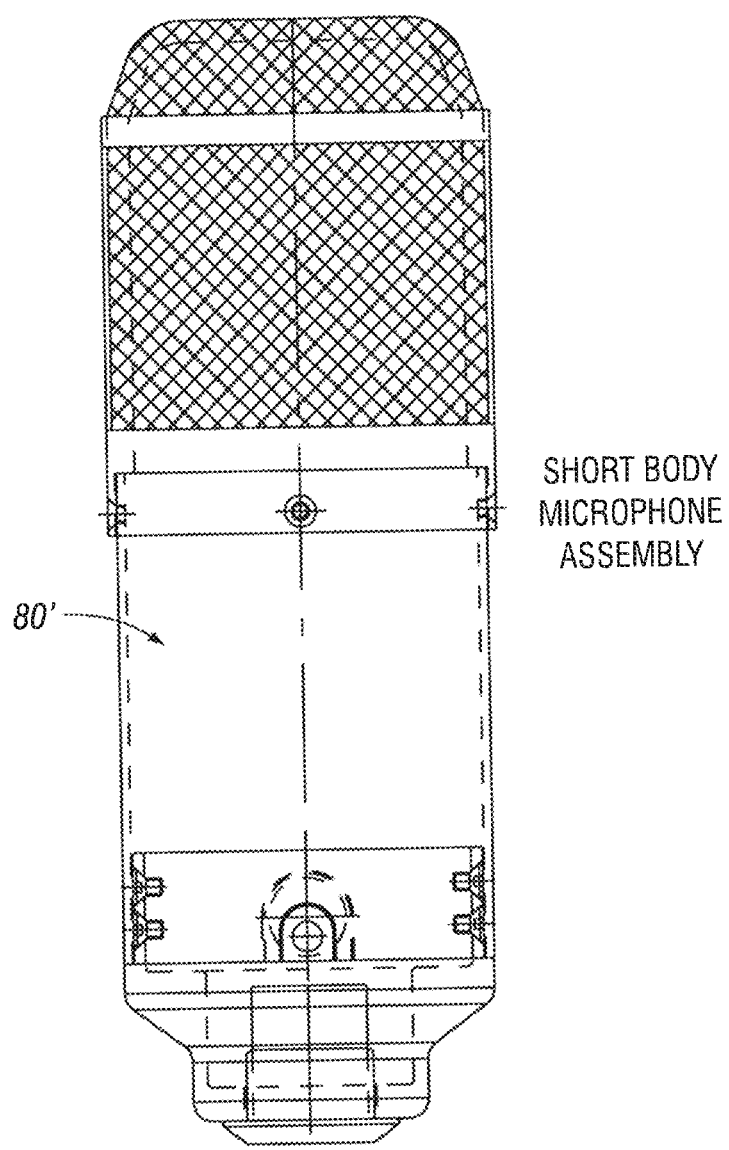

FIGS. 8C and D are non-limiting examples of two form factors for the mic of FIG. 8A.

FIGS. 9A and B are opposite side elevation views of the mic of FIG. 8A.

Figure 9C:
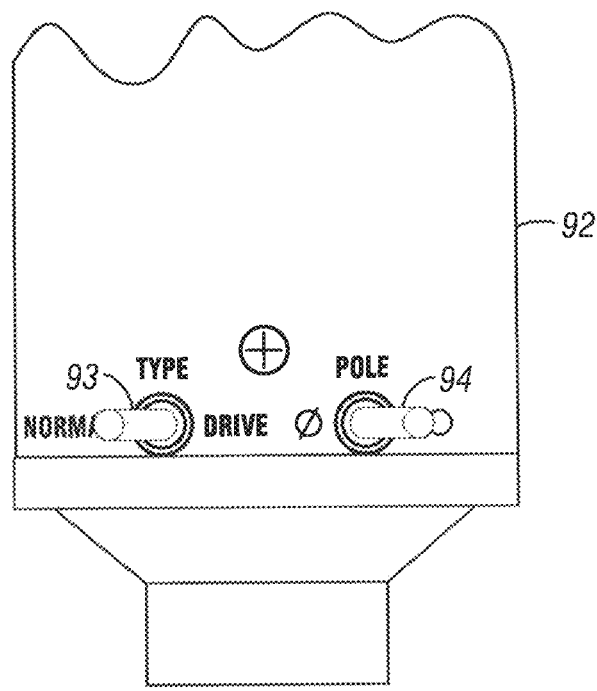
Figure 9D:
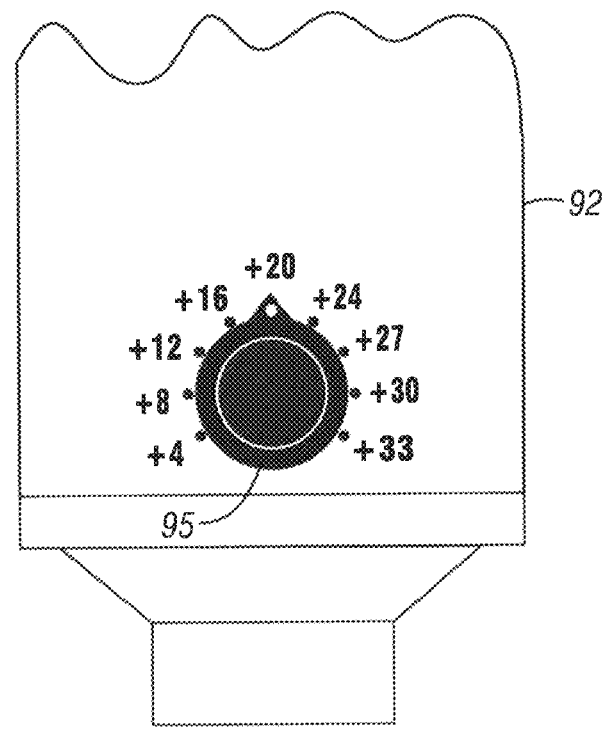

FIGS. 9C and D are enlarged isolated views of user controls at the bottom of opposite sides of the mic of FIGS. 9A and B.

Figure 9E:
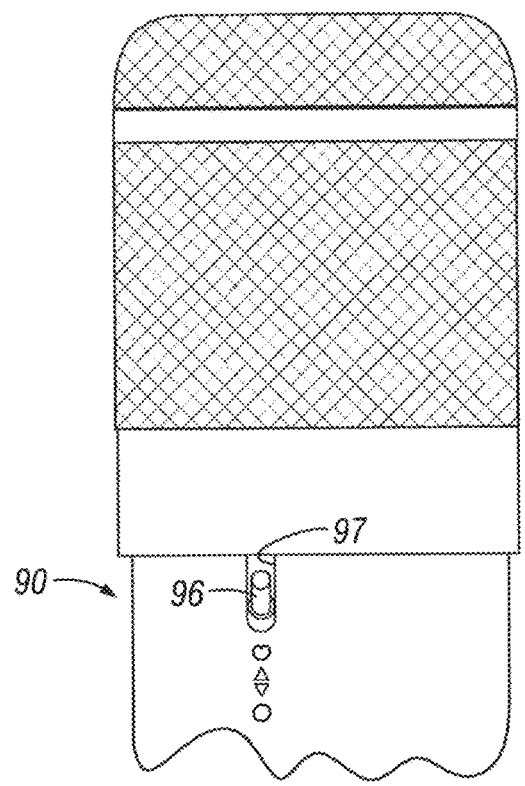

FIGS. 9E and F are enlarged isolated views of user controls at the top of opposite sides of the mic of FIGS. 9A and B.

Figure 9F:
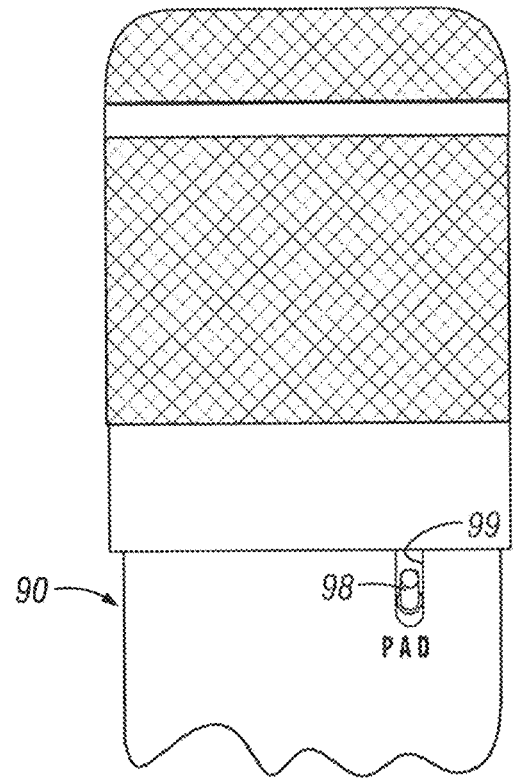
Figure 9G:
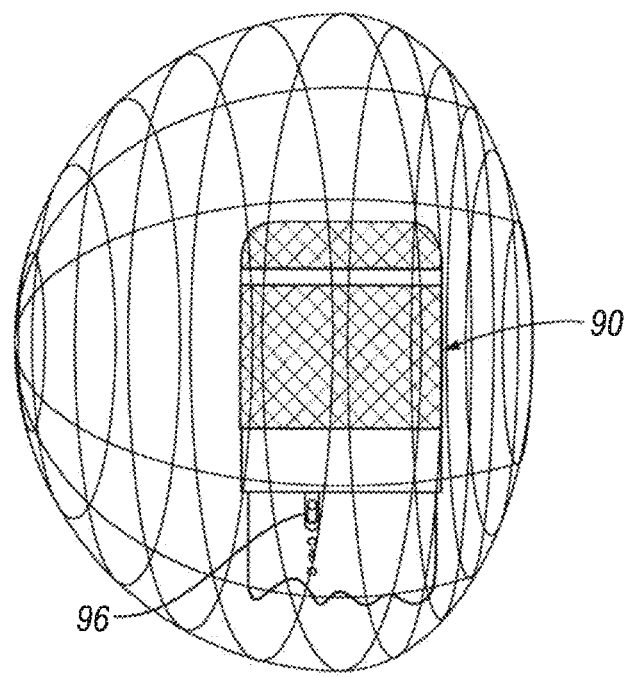

FIGS. 9G and H are diagrammatically illustrations of input sensitivity for different settings of the mic of FIGS. 9A and B.

FIGS. 10A-C are reduced-scale perspective and front and rear elevation views of the external power supply of FIGS. 8A and B.

FIGS. 11A-C are assembled elevation view, cross-section, and elevation views respectively, of heat management techniques for the mic according to the invention.

FIGS. 11D-H are exploded elevation first side of cylindrical wall and bottom cap but without top cap (FIG. 11D); assembled sectional elevation of first side, bottom cap and with top cap (FIG. 11E), isolated plan view of top cap alone (FIG. G), side section without top cap or bottom cap (FIG. 11F), and opposite side exploded elevation of cylinder and bottom cap but without top cap of one example of a mic according to the invention (FIG. H).

FIG. 12 is a diagrammatic depiction of the external power supply of FIGS. 8A and B with optional heat management technique, including the ability to move some internal components from the mic to the external power supply.

Figure 13:
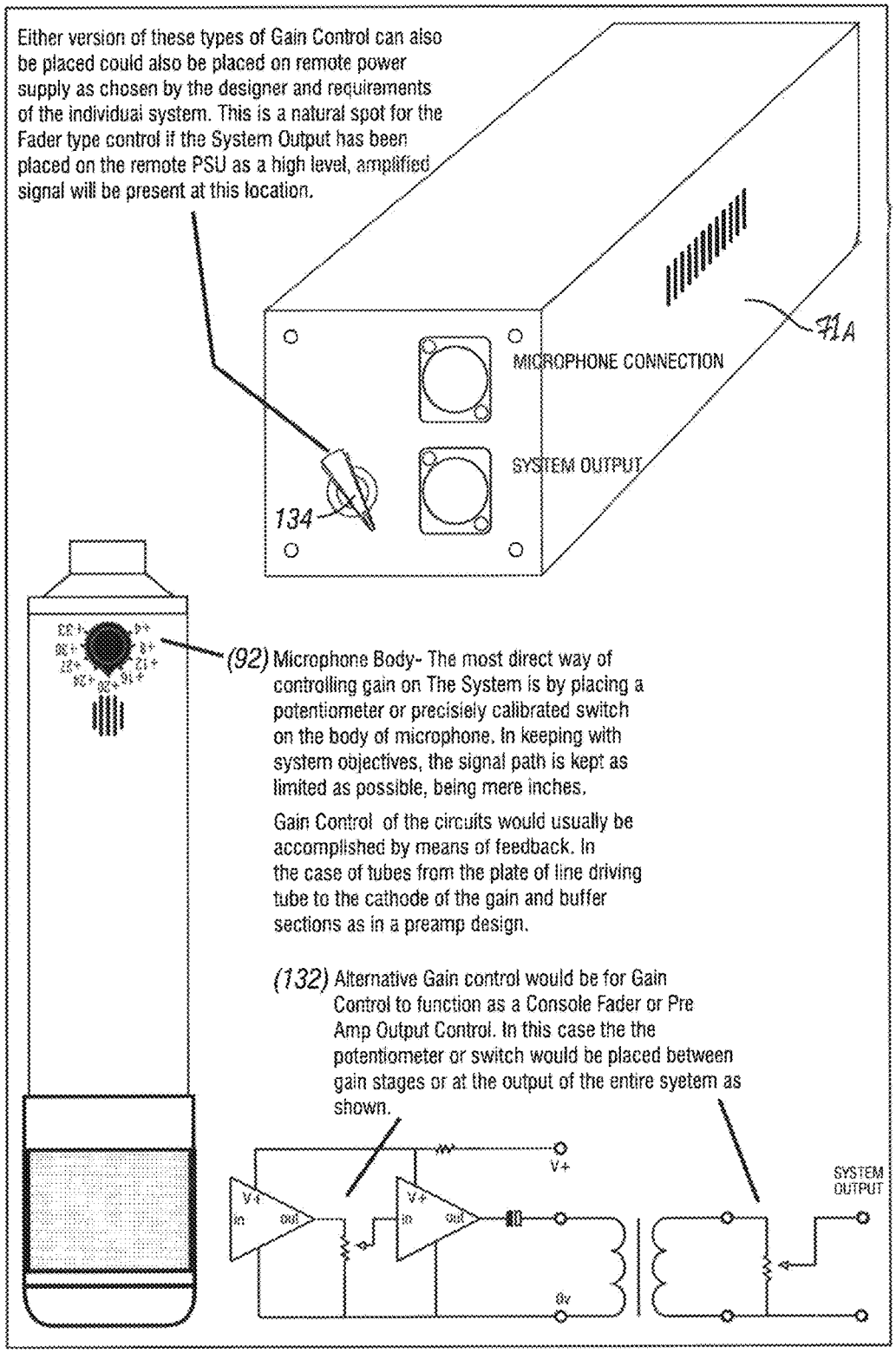

FIG. 13 is a diagrammatic depiction of a mic and external power supply such as in FIGS. 8A and B and one example of user selectable gain control options that can be built into the combination and used individually or in combination.

FIG. 14 is a diagrammatic depiction of non-limiting examples of different mic transducers or capsules that can be used in at least some of the embodiments of the mic assembly according to the invention.

IV. DETAILED DESCRIPTION OF EXEMPLARY EMBODIMENTS OF THE INVENTION

A. Overview

For better understanding of the invention, a few examples of forms the invention can take will now be described in detail. As will be understood by those of skill in the art, the invention can take a wide variety of forms and embodiments. The following examples are neither exclusive nor inclusive of all possible forms. Variations obvious to those skilled in the art will be included within the invention which can be applied and fabricated in analogous ways.

Following will be a generalized discussion of the concept, and then a specific discussion of examples of device fabrication and implementation. Thereafter will be a discussion of some examples of alternatives and options.

B. Generalized Concept

1. Apparatus

In a generalized sense, the invention relates to a change in paradigm in the state of the art of professional audio microphones. It presents a microphone assembly that can house not only the microphone capsule (of whatever type or form), but also components that allow the assembly to then be plugged directly into a variety of downstream audio handling components without having to customize or reconfigure the assembly. For example, the new paradigm includes a combination of features in a single microphone housing that facilities direct connection to any one of an analog audio recorder, a digital audio recorder, or even at least most mixing consoles. This is counter-intuitive to the state of the art, which requires intermediary external components between microphone and recorder. Aspects of the invention include a selection and balancing of factors, some of which are antagonistic to each other.

Figure 7:
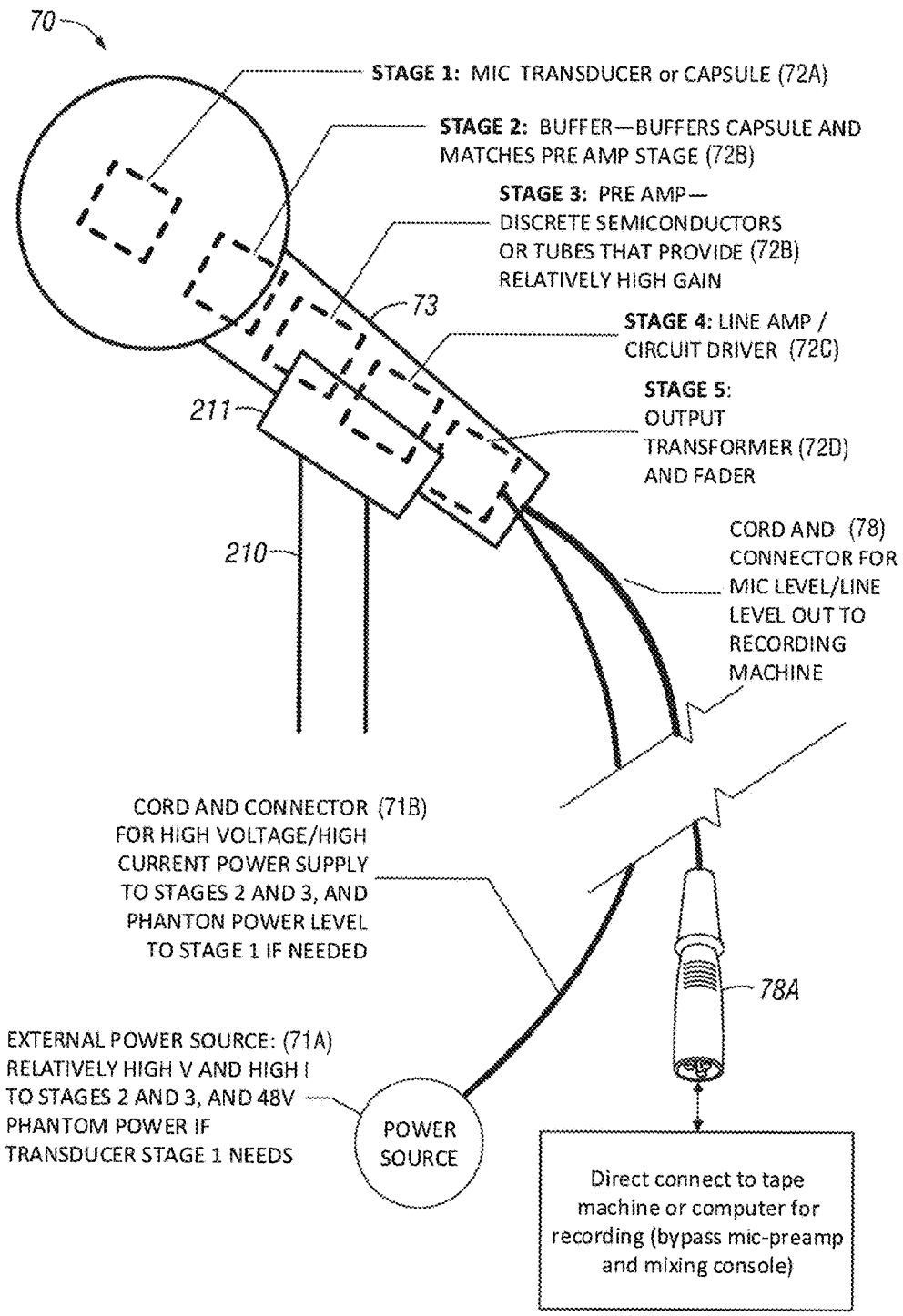
FIG. 7 is an illustration of a microphone assembly according to one exemplary embodiment of the invention.

In one example, in general form, the invention can be implemented as indicated at ref no. 70 in FIG. 7. A microphone housing 73 includes a signal path from capsule 72A to output 72D that includes the capsule 72A as sound transducer, a buffer stage 72B, a line driving stage 72C, and an output stage 72D. A cable 78 from the housing of indeterminate length terminates in a connector 78A that can operable connect the output to an analog or digital recorder, mixing console, or other components. Yet the microphone assembly 70 outputs a signal that is sufficiently buffered, amplified, and driven that it can retain its fidelity and quality even across long cable distances. Thus, external electrical power 71A is provided through a separate electrical connection 71B to a relatively high voltage, high current power source. If the mic transducer needs phantom power, it can also be obtained from that external power source. The interoperability of this combination changes the state of the art in at least the following ways. The system can be configured to have cord 78 go from mic body 73 to recording machine directly as shown in FIG. 7, or cord 71B could include two-way communication between mic internal components and power source 71A plus output for those components. Output can then be passed to the recording unit (see FIG. 8B).

Our new design eliminates the need for preamplifier pads for loud sources since redundant gain circuits are eliminated, and gain is managed at an earlier stage of the signal path. Impedance of the input amplifier should be kept high regardless of circuit topology.

Our circuit allows for the microphone to be plugged directly into any analog tape recorder, stand alone digital recorder, or computer based recorder, and bypass external the mic-preamp and/or mixing console entirely. It is, however, capable of interfacing with a mixing console, when hybrid mixing systems are in use (a USB microphone could not). For example, analog mixing consoles, stand alone digital recorders, and stand alone digital mixers would not have features to support them. USB ports and the ability to run MAC or Windows OS are required at the minimum.

One way the generalized invention can be built is as follows:

A single microphone body or housing that contains:
- a) a microphone, namely a transducer or capsule;
- b) a pre-amp, namely a microphone pre-amplifier; with the ability to adjust overall gain of the unit.
- c) a console style fader, namely for volume control, master volume;
- d) a line driver capable of interfacing in any professional audio environment;
- e) a circuit operatively connecting the microphone, pre-amp, and line driver, and console style fader/volume control;
- f) a cord that is connectable to a further component (e.g. recorder or mixer); the circuit uses both an audio cable and a power cable that provides 48 volt phantom power and DC voltage for high power solid state circuits as well as high voltage supplies for tube circuits, and the heaters associated with them;
- g) a power source comprising typically a stand-alone external, table top size dedicated power supply; the power source comprises high voltage, high current power supply as used in microphone pre-amps, HiFi audio, and mixing consoles. This allows the microphone to be built with high power (and excellent sounding) amplifiers that will drive long lines at maximum fidelity, instead of using low levels signals that can become susceptible to grounding issues and audio quality degradation. This also allows use of much less circuitry (e.g. transformers or balancing amps; fewer amplifiers).

Current microphone designs are still using concepts developed in the early 20th century. A transducer followed by a high impedance, low power, low gain buffer. Even when tubes were replaced by solid state devices the same practice continued, but the with the low gain triode being replaced by an even smaller power, lower current FET buffer.

A comparison of FIG. 1A to FIG. 2A illustrates the change in paradigm. The state of the art microphone configuration 10 of FIG. 1A uses just a capsule, simple buffer, and simple output transformer in the microphone housing. Cable connections provide (if needed) phantom power to the housing, but connect the housing to an external pre amp. The external pre amp includes additional transformers, as well as gain control, drivers, and fader before it can be interfaced with such things as a recording device. In contrast, the new paradigm of the invention at 22 in FIG. 2A combines the following: a capsule 22A, a gain amp and buffer 22B, a line amp/output driver 22C, an output transformer 22D, and a fader 22E; all on-board the mic housing. Cabling 28 connects the output signal path directly to a recording device 29. Cabling 71B also provides phantom power but also higher power to the gain and line amp components from an external power source 71A through its cable 71B (or cable 88 FIG. 8B).

The same is true with a comparison of FIG. 1B versus 2B. FIG. 1B illustrates another typical state of the art paradigm. Sometimes the state of the art mics are plugged directly into an external mixing console. Note how the console includes transformers, as well as amps, drivers, fader, and equalizer. It can also further include components of a pre amp (more buffering and amplification) before it is connected to a recording device. FIG. 2B shows how the new paradigm of the invention can reduce or eliminate much of those external intermediary components. Electrical power for the gain amp/buffer 22B and line-amp/output driver 22C are from an external power source 71A.

Therefore, the invention can include the following types of features and benefits over the state of the art configurations:

a. Improved sonics and decreased tonal degradation as long lines are not needed to connect microphone in the studio to the mixing desk or pre amplifier in the control room.
b. Simplification of signal path, ease of use and highly improved work flow.
c. Shorter signal path for sonics. need for less routing and shorter cable lengths in complicated systems. cost savings to customer who no longer needs to purchase separate preamplifiers or mixers to record professionally.
d. With the correct circuits, you can both buffer the capsule correctly and include high gain pre amps circuits as well as provide high power outputs capable of driving any circuit in the modern recording studio.
e. This application can be used with discrete semiconductors, modern op amps, and even tube designs.
f. High voltage power source provides increased flexibility with circuits used in microphone (see below).
g. Gets rid of redundant circuits that may be present in both a microphone and microphone pre-amp, and mixing consoles.
h. Eliminates the need for external pre amplifiers and/or mixers in a professional environment.
i. Allows for unprecedented simplicity in work flow, being analog, digital, or hybrid recording situations.

As will be appreciated by those skilled in the art, the new paradigm essentially selects and integrates in a single housing:

1. Transducer (capsule) from microphone
2. Gain control as a mic pre amp or mixing console input
3. Phase reverse control as on mic pre amp and mixing console input
4. Gain circuit as on mic pre amp and mixing console input
5. Line driver as on mic pre amp and mixing console outputs
6. Capsule Pad as on a microphone
7. Selectable Pickup pattern as on microphone
8. Output fader as on mixing console In contrast, newer attempts in a home or bedroom quality setting of direct-plug-in microphones, such as USB mics, differ in at least the following ways. USB mics cannot:

i. Connect to an analog mixer. Analog mixer would not have the ability to run Mac or Windows OS required by the USB microphone. Would not have USB ports.
ii. Connect to an analog tape machine. Analog mixer would not have the ability to run Mac or Windows OS required by the USB microphone. Would not USB ports.
iii. USB microphones are generally designed as slightly higher quality replacement of the built in mic on a computer. Generally used for podcasts and voiceovers.
iv. Are not designed to professional sound standards. A quick survey of available USB microphones shows that some cannot handle high enough SPLs (sound pressure levels) to accommodate a real world recording environment where loud sources such as drum sets and guitar amplifiers are employed. Also, a number did not even publish this data at the time of application. For reference these phrases are taken directly from marketing information of a known USB microphone
v. Designed for vocal and acoustic instrument recording
vi. Also, great for recording interviews, podcasts, voice overs, and audio for video"

One microphone for sale on a music equipment website is even called "the Podcaster". But note the following regarding such microphones.

USB microphones induce latency. This induces a delay that could not be tolerated in a live application where the vocal, for example, would be perceived to be lagging behind the rest of the instruments. Professional digital systems employ delay compensation within their software to delay all signals by the same number of samples to ensure that all signals are heard in the correct time base. USB microphones are not sophisticated enough to do this.

Bit Depth. Some (but not all) USB microphones do not function at the bit depth or current professional audio systems which have advanced well beyond the 16 bit/44.1 kHz sampling frequencies of the past. The author could not find a single USB mic that could record at the sample rates available on current professional audio digital recorders which is 24 bit/192 kHz.

Requires Mac or Windows OS to operate. Analog mixers, stand-alone digital recorder, stand-alone digital mixing consoles, and others either do not use an operating system or are systems designed specifically for that product.

The approach of the invention allows such things as:

a. Approach presentation from a universal perspective that could be applied to tube, discrete solid state, or integrated circuit technologies.
b. Present support for Professional Audio and Live sound applications. Not intended to cover areas of use related to USB microphones.
c. change in amplifier requires manipulating circuit for proper tonal characteristics, and proper selection of capsule (e.g. pentode following capsule may affect tone).

It can therefore be seen by reference to FIG. 1A (prior art) compared to FIG. 2A (high-level schematic of one implementation according to the invention), the paradigm shift in integrating into the microphone body specific components that allow direct connection to a recording device. An external power supply is used to provide power to the microphone body. But this external supply is relatively inexpensive, portable, and therefore can be part of a kit for each microphone, along with the appropriate cabling for a microphone system. Similarly, a comparison of FIG. 1B (prior art) to FIG. 2B (high-level schematic comparison of differences between the invention and another state-of-the-art system) can be seen. These examples show a simplification of signal path by the integrated microphone of FIG. 2A relative to the microphone with external microphone preamplifier as shown in FIG. 1A. When compared, FIG. 2A shows a simplified signal path plus the main component count can be reduced by roughly 50%.

In the comparison of FIG. 2B to FIG. 1B, where the prior art configuration is a microphone with mixing counsel signal path, again the differences are stark.

2. Design Criteria/Considerations/Rules

As previously mentioned, making and using the invention requires consideration of and balancing of a number of factors. Some are antagonistic with one another. Because the invention can take different forms and embodiments, below are some of the considerations and balancing that will inform a designer.

When undertaking application of the invention (e.g. microphone, preamp, line driver, and fader concept), the designer should consider these elements.

a. Proper Microphone Design and Condenser Application.

1) Change in amplifier requires manipulating circuit for proper tonal characteristics.

2) Proper selection of capsule. Generally speaking a capsule would be designed that both compliments the tonality of the circuit being designed but also fulfills requirements for the desired reproduction of sound. Parameters such as capacitance of the capsule, materials for the membrane and sputtering of the diaphragm, and overall design of the capsule backplane must be observed. Suppliers can be found that over generic versions of capsules but the author has found that these are less suited for our improved microphone application.

3) pentode following capsule can affect tone. Pentodes have characteristics known to be different than triodes and these are widely documented. Since pentodes, to authors knowledge, have not generally been used in microphone designs these tonal and operation characteristics much be considered, especially when choosing a capsule or transducer.

b. Design of Pre Amplification

Since the amplification following the transducer is different than past microphone designs various parameters must be considered. For example, the higher gain pentode used in this approach will have more noise than the triode so structure of gain must be properly applied (see below). In our final tube design, that is attached as part of this document, we were able to obtain noise figures that were well below the authors own designs of stand-alone pre amplifier and microphone combinations, for the reasons outlined in this document.

c. Design of Power Amplifier and Line Drivers

Because we are combining both microphone and pre amplifier design into one small unit, we must consider the differences in the two types (e.g. compare FIGS. 1B and 2B) of design. External pre amplifiers generally use a step up transformer, on their input, to create additional gain and improve noise specifications. Because on a microphone the capsule is directly coupled to the input stage, it does not use the gain increasing input transformer of a typical external tube pre amplifier circuit. A transformer cannot be used between the capsule and amplifier because of its effect on the capsule function (low resistance, low impedance etc.), therefore special design parameters must be followed. Design must be such that 30-40 dB of overall voltage gain is achieved, while maintaining proper interfacing with the capsule, adequate gain, and line level high quality interfacing with the rest of the recording studio. Too much gain will increase noise and distortion or require unusually high amounts of feedback to control, thus degrading sound quality. Borderline amounts of gain will limit its application to very high level sources. The applicant has found that 33-36 dB of gain is optimal, when considering the increased sensitivity and improved translation of sound in the invention but the invention is not necessarily so limited.

To that end the designer should follow these rules and application notes (please note these are references to our application using a tube circuit (see FIG. 3), others are provided later for solid state and integrated circuits (see FIGS. 4-5).

i. Specific Rules for Tube-Based, Pentode, Version 30 (e.g. FIG. 3)

Figure 3:
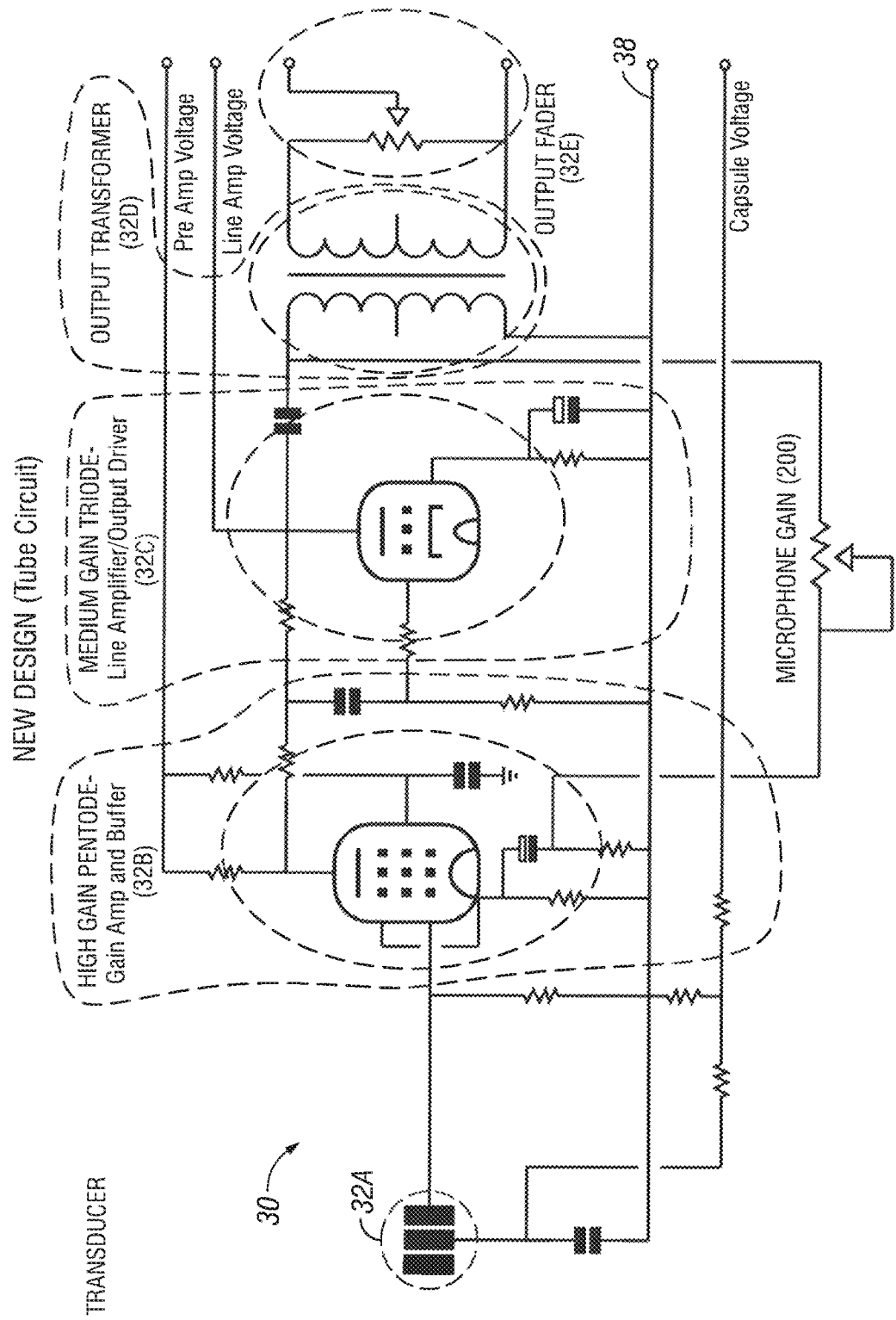
FIG. 3 is a diagrammatic depiction of a first exemplary embodiment of the present invention.

With particular reference to FIG. 3, one non-limiting example of a tube-based implementation of aspects of the invention is set forth regarding how the internal components in the microphone body would be configured.

1) Gain should be spread, somewhat, evenly between pre amplifier 32B and Line amplifier 32C stages. Keeping in mind of course that the Pentode has a higher gain factor than the line driving triode.

2) Input amplifier 3B must function as both the buffer as on a standard microphone but also a variable gain amplifier as on a pre amp, as noted below.

A) In a tube circuit, for example, the simple low gain triode would be replaced with a high gain pentode designed to have very high impedance and where gain is controllable through negative feedback. See FIG. 3.

B) Impedance of the input stage must be extremely high to avoid loading the capsule 32A but also to avoid interaction of the gain control with the capsule. In classic tube microphone designs input impedance was as low as 30 megaohm (30 million). When applying our concept of the microphone and pre amp in one in the embodiment of FIG. 3, a minimum input impedance of 1 gigaohm (1,000 million), or 33 times higher, can be used to ensure proper operation and sound as outlined above.

C) Pre amplifier stage has 30-35 dB of available gain.

D) Feedback across the amplifier controls gain but also stabilizes circuit and reduces interaction with the capsule.

E) Judicious use of feedback between stages being beneficial to achieve proper distortion, noise, and gain figures.

F) It is beneficial to control gain, in this version, using feedback from the output of the second stage through variable resistance to the cathode of the first stage. This will minimize effects of the gain control on the capsule and the input impedance of the gain stage.

Since standard microphones do not have a line level output driver, one must be designed and added using these parameters.

1) Line driver 32C has on the order of 30 dB of available gain.

2) The valve for the output stage 32C is run in a high-current, low voltage condition to allow for adequate current swing at the output. This ensures high headroom and ability to drive any source that may be required in the studio application.

This valve is usually a readily available triode (see FIG. 3) of the type typically used in high quality HiFi applications such as a 6CG7, 6DJ8.

c. Design of Output Transformer

The output transformer 32D should be thought of as a combination of a microphone output and as a typical line level valve output. Generally, it will be a step down transformer with a loss of around 20 dB, but varying based on the impedance needed to match the tube chosen for the line driver. Our application uses a mixture of a standard tube line stage but with the lower 200 ohm output of most microphones. The 200 ohm output allows for variation in its use as well as lowering the noise floor. Since the output of the overall circuit is 200 instead of the standard 600 ohms, the unit can be used as a standard low gain microphone, by setting the feedback to maximum, or as our high gain microphone with pre amp application with variable gain. Therefore, it increases the useful range of the microphone 30 even further beyond that of a typical microphone, as it can be used in either application. Output fader 32E can be included.

i. Specific Rules for Tube-Based, Triode, Version (e.g. FIG. 4)

Figure 4:
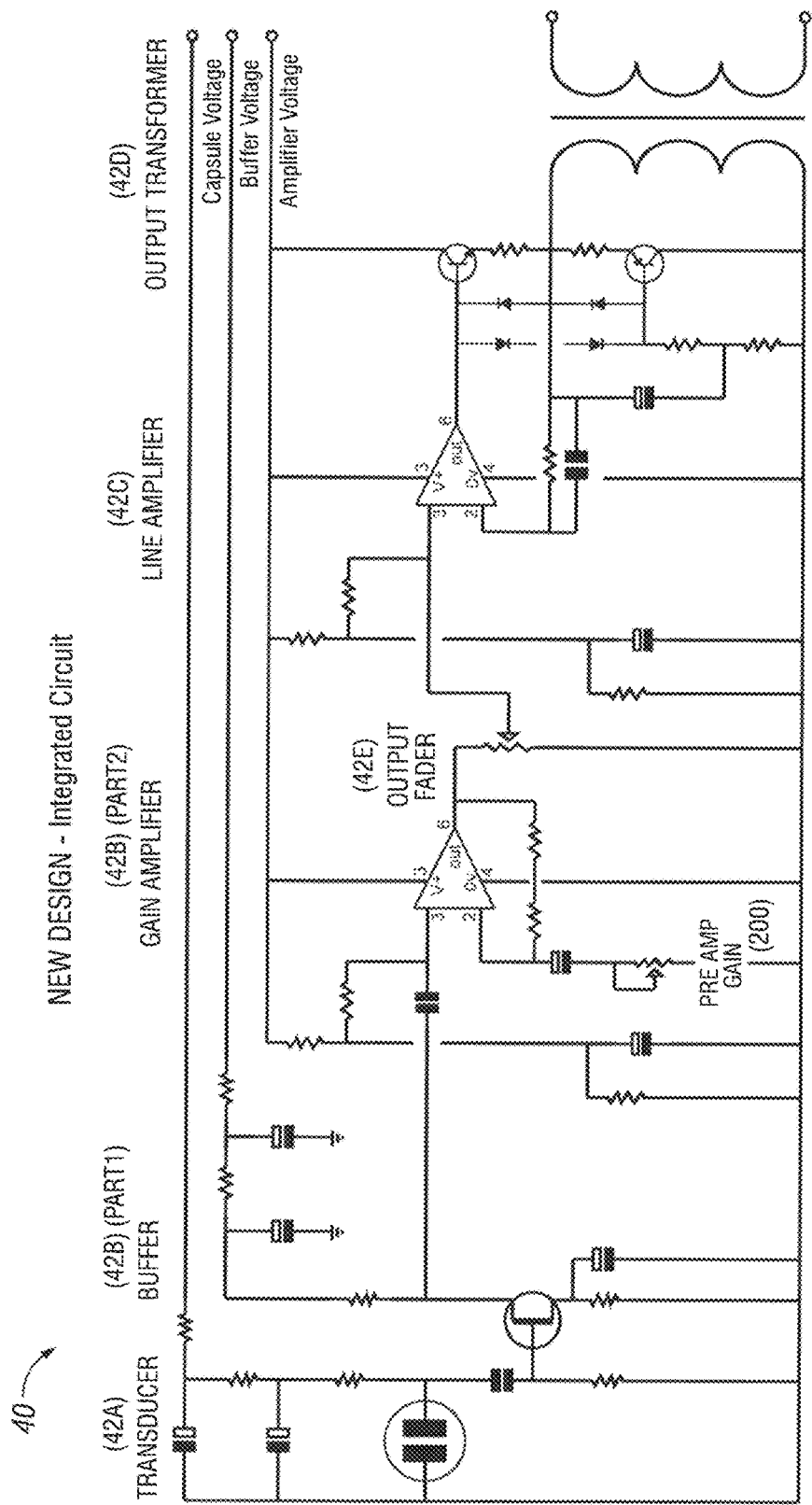
FIG. 4 is a diagrammatic depiction of a second exemplary embodiment of the present invention.

A dual triode design using a single dual triode tube such as a 12zx7, allows a simpler, more cost effective, easier to design, and lower heat application in this embodiment 40 of the invention in FIG. 4.

1) Gain should be distributed evenly between pre amplifier 42B and line amplifier stage 42C. In this case using two triodes in cascade may allow the gain to be spread somewhat more evenly between the stages than the Pentode version of FIG. 3.
2) Input amplifier 42 must function as both the buffer 42B (Part 1) as on a standard microphone but also a variable gain amplifier 42B (Part 2) as on a pre amp, as noted below.
   A) In this tube circuit, for example, two medium gain triodes in cascade are designed to have very high impedance and where gain is controllable through negative feedback.
   B) Impedance of the input stage 42B must be extremely high to avoid loading the capsule 42A but also to avoid interaction of the gain control with the capsule. In classic tube microphone designs, input impedance was as low as 30 megaohm (30 million). When applying our concept of the microphone and pre amp in one, in this example a minimum input impedance of 1 gigaohm (1,000 million), or 33 times higher, is used to ensure proper operation and sound as outlined above.
   C) Pre amplifier stage 42 must have 30 dB of available gain.
   D) Feedback across the amplifier controls gain but also stabilizes circuit and reduces interaction with the capsule 42A.
   E) Judicious use of feedback between stages being beneficial to achieve proper distortion, noise, and gain figures.
   F) It is beneficial to control gain, in this version, using feedback from the output of the second stage through variable resistance to the cathode of the first stage (see ref no. 200). This will minimize effects of the gain control on the capsule and the input impedance of the gain stage.

Since standard microphones do not have a line level output driver, one must be designed and added using these parameters.

1) Line driver 42C should have 30 dB of available gain.
2) The valve for the output stage is run in a high-current, low voltage condition to allow for adequate current swing at the output. This ensures high headroom and ability to drive any source that may be required in the studio application. This valve is usually a readily available triode of the type typically used in high quality HiFi applications such as a 6CG7, 6DJ8.

e. Design of Output Transformer

The output transformer 42D should be thought of as a combination of a microphone output and as a typical line level valve output. Generally, it will be a step down transformer with a loss of around 20 dB, but varying based on the impedance needed to match the tube chosen for the line driver. Our application uses a mixture of a standard tube line stage but with the lower 200 ohm output of most microphones. The 200 ohm output allows for variation in its use as well as lowering the noise floor. Since the output of the overall circuit is 200 instead of the standard 600 ohm, the unit can be used as a standard low gain microphone, by setting the feedback to maximum, or as our high gain microphone with pre amp application with variable gain. Therefore, it increases the useful range of this embodiment of the invention even further beyond that of a typical microphone, as it can be used in either application. An optimal output fader 42E can be implemented as shown.

i. Specific Rules for Integrated Circuit-Based Version (e.g. FIG. 4)

Generally speaking, discrete transistor and IC based designs can follow similar procedures. For the sake of showing how our design approach can be implemented in a number of varieties, the drawing and description for each circuit type are shown with their own variations.

Integrated Circuit

1) Gain should be spread relatively evenly between pre amplifier 42B (parts 1 and 2) and line amplifier 42C stages.
2) Input amplifier 42B is shown with a different possible variation that combines of FET buffer transistor with Integrated Circuit gain amplifier.
   a) As in the tube circuit example, the impedance is kept extremely high to avoid loading the capsule and to avoid unwanted interaction with the gain control and capsule in general. On the order of 1 gig ohm should be considered minimum.
   b) Pre amplifier 42B should have up to 30 dB of available gain.

Since standard microphones do not have a line level output driver, one must be designed and added using these parameters.

1) Line driver 42C and output transformer 42D combination should have 10-20 dB of available gain. Design should be such that correct gain and headroom are achieved with lowest noise.
   a) Because sold state designs generally do not use step down transformers on their outputs (as do tube circuits), less amplifier gain is needed for the line stage. On the order of 10 db gain for the amplifier 42C and 10 dB step up for the transformer 42D would generally be considered more than adequate.
   b) 200 ohm output is preferred to typical 600 ohm to allow for the variation and flexibility as outlined under tube versions. Generally speaking a 4 dB step up transformer will then be preferred for proper balance of headroom and noise characteristics.
2) As with the tube circuit a high current output section 42D with adequate swing is required.
   a) Our example shows an integrated circuit input section with a complimentary pair of output devices to add additional power and improve sonics of the standard operational amplifier.

ii. Specific Rules for Solid State-Based Version 50 (e.g. FIG. 5)

Discrete Transistor

1) Gain should be spread somewhat evenly between Pre Amplifier 52B and Line amplifier 52C stages.
2) Input amplifier 52B should combine both buffer and gain sections and should also have variable gain as on a pre amp, as described below.
   a) This example (FIG. 5) shows the use a high impedance FET connected as part of a DC coupled pair with feedback used to control the circuit gain. This essentially matches the function of the Pentode in the tube circuit (FIG. 3) description in a solid state world.
   b) As in the tube circuit (FIG. 3) example, the impedance is kept extremely high to avoid loading the capsule 52A and to avoid unwanted interaction with the gain control and capsule in general. On the order of 1 gig ohm should be considered minimum.
   c) Pre amplifier 52B should have up to 30 dB of available gain.

Since standard microphones do not have a line level output driver one must be designed and added using these parameters.

1) Line driver 52C and output transformer 52D combination should have 10-20 dB of available gain. Design should be such that correct gain and headroom are achieved with lowest noise.
   a) Because sold state designs generally do not use step down transformers on their outputs (as do tube circuits) less amplifier gain is needed for the line stage. 10 db gain for the amplifier 52C and 10 dB step up for the transformer 52D would generally be considered more than adequate.
   b) 200 ohm output is preferred to typical 600 ohm to allow for the variation and flexibility as outlined under tube versions. Generally speaking a 4 dB step up transformer will then be preferred for proper balance of headroom and noise characteristics.
2) As with the tube circuit (FIG. 3), a high current output section 52D with adequate swing is typically desired or required.
   a) Our example shows the line driver in a Class A arrangement, selected for its pleasing tonality as well as its ability to drive a range of circuits in the studio environment.

Optimal fader 52E is shown, as is pre amp gain control 200.

C. Specific Example 1 (Tube-Based) (FIG. 3)

With reference to FIG. 3, one way to implement the invention is illustrated.

1. Input Stage

A sound transducer or capsule 32A is selected. This can be any of a number of off-the-shelf, commercially available capsules. Examples are: A high quality historically accurate replacement transducer is available from Thiersch Elektroakustik. http://www.thiersch-mic.de/en/estm_service_cap_bl.html. The mic level signal from the transducer 32A is fed to the high gain pentode 32B and medium gain triode 32C prior which produces a line level signal that is output from the mic housing 33 through an isolating transformer 32D.

External power for "pre amp voltage" to the pentode and "line amp voltage" to the triode can be from an external dedicated power supply (schematically shown at ref no. 17A) through separate pin connectors or conductors. An example of a possible external dedicated power supply is as follows. While it is recommended that transformers and power supplies be designed specifically for each project, versions of these items can be sourced fairly easily. For tube versions of our application the power supply must be constructed to match the voltage requirements of the chosen tubes. This can be done easily by using an off the shelf transformer (e.g. Hammond Power Solutions of Baraboo, Wis., USA is one supplier) in combination with a simple pass transistor for the mains and a basic regulator arrangement for the heaters. For solid state and IC versions of the circuit, however, off the shelf power supplies ranging from standard open frame power supply modules to high current "wall warts" such as these can be used:

(1) http://www.mouser.com/ProductDetail/Mean-Well/EPP-300-48/?qs=sGAEpiMZZMs%252bVr-H5rwl1mWOmnbgLiPQGpRWZHwoQM0%3d.

(2) http://www.mouser.com/ProductDetail/Ault-SL-Power/TE20A4803B01/?qs=sGAEpiMZZMs%25-2bVrH5rwl1kCa5Dr%252bEJuvl8MzUNZDXOuuNC%2fpLgohzA%3d%3d.

If needed, the equivalent of phantom voltage to the capsule is provided by a dedicated "capsule voltage line" (e.g. 48 VDC) from that same external power supply 17A.

A reference line is indicated in the thicker black line in FIG. 3. The signal path from transducer 32A (mic level) through the tube circuit 32B and 32C (to generate line level) to the transformer 32D is illustrated in FIG. 3. After isolation through the transformer 32D, that line level signal is sent over a hardwire cord 38 of indeterminate length. It could be a few inches to a hundred or more feet. It can terminate in a variety of connectors. One example is XLR.

2. Buffer Stage

The buffer 32B and line driver 32C can be implemented with analog tube components. In this example, the buffer stage 32B includes a high gain pentode as a high gain amplifier. As shown in FIG. 3, additional circuit components (e.g. resistors, diodes, capacitors, etc.) can be configured to produce the desired high gain buffer function of this stage. Through knowledge or empirical testing, those of skill in the art can select those components and their values to meet needs or desires for the design, following the design rules discussed earlier for a tube-based design.

Pentodes are electronic amplifying vacuum tubes or valves. Pentodes can have higher current outputs and a wider output voltage swing than tubes such as tetrodes and triodes.

As a general rule, this stage receives a relatively low level electrical signal from the capsule. The buffering is basically to minimize effects of the amplifier stages on the capsule. The pentode provides high gain (e.g. an EF86 pentode has a gain factor of 38).

The pentode is powered by external power 71A (e.g. suitable voltage range will depend on the pentode of your choice. For example, a 6AK5 pentode call for a plate voltage of 120-180 volts at 7.5-7.7 mA and 6.3 volt heaters at 175 mA) via a dedicated "pre amp voltage" line. One example of a possible pentode is Model No. 6AK5 from TubeDepot. http://www.tubedepot.com/products/5654-6ak5w-6096.

Line Driver Stage

The line driver 32C can also be implemented with analog tube components. In this example, it includes a medium gain triode. Triodes are electronic amplifying vacuum tubes that can be applied to provide power gain at audio and radio frequencies. Additional circuit components (e.g. resistors, diodes, capacitors, etc.) can be configured to produce the desired line driving function of this stage (see FIG. 3).

As a general rule, this stage receives an amplified signal from the pre amp stage 32B and provides further gain to enable relatively high voltage, high current driving of the output signal. This triode provides medium gain (e.g. for example a 6CG7 tube has an amplification factor of 20) as a relative matter and is powered by external power (e.g. suitable voltage range will depend on the triode of your choice). For example, a 6CG7 triode calls for a plate voltage of 50-250 volts at 9-10 mA and 6.3 volt heaters at 600 mA) via a dedicated "line amp voltage" line. See FIGS. 7, 12 and 13 for examples of external power supply 71.

One example of a possible triode is Model No. 6CG7 from TubeDepot. https://www.tubedepot.com/products/electro-harmonix-6cg7-6fq7-eh-preamp-vacuum-tube.

Note that in this example, a rheostat or equivalent (see caption "microphone gain" and ref no. 200) allows some range of manually-controlled variation of gain by use of feedback from the output of the line stage to the cathode of the gain stage.

This stage is called "medium gain" because triodes tend to have less gain the pentodes and tube are usually represented as high-gain (or high-mu) or medium gain (or mu) etc.

3. Output Stage

An output transformer 32D and optional fader 32E are used to electrically isolate the output signal match impedances to equipment following, isolate, create or adjust tonality, is part of the overall gain scheme of the unit respectively.

One example of a possible transformer is Model No. 4935 from Sowter Transformer of Ipswich, England. One example of a possible fader is Model No. 380C25000 from Honeywell, USA.

4. Housing, Cabling, and Connectors

As diagrammatically illustrated in FIG. 7 (as well as FIGS. 8-14), the circuit of FIG. 3 can be a packaged in a single housing 73 (of portable or hand-held form factor), including the various stages of FIG. 3. Materials for the housing can vary but generally would be at least similar to state-of-the-art mic housings. A cable or set of cables can communicate between the housing and the various sources or destinations indicated in FIG. 3. The cabling and connectors for the various lines/signals in the cabling can vary. One example is an XLR connector, at least for phantom power and mic output. Other examples might include DIN, TS, Speakon, TRS, or TT connectors.

Cables can be XLR to XLR, TRS to TRS, XLR to TRS, etc.

As can be seen, the specific embodiment of FIG. 3 provides at least most of the benefits of the generalized invention, including a single housing with the various stages to allow flexibility of plug in directly to analog or digital recorder, or mixing console.

Even though tubes have generally been eclipsed by ICs and solid state components, in the professional audio field, there is a demand for the same.

D. Specific Example 2 (Integrated Circuit-Based) (FIG. 4)

1. Input Stage

The input stage sound transducer/capsule 42A can be as described with Specific Example 1 above.

2. Buffer Stage

The buffer 42B and line driver 42C can be implemented with integrated circuits. In this example, the buffer stage 42B includes integrated circuit amplifiers as shown in FIG. 4. Additional circuit components (e.g. resistors, diodes, capacitors, etc.) can be configured to produce the desired high gain buffer function of this stage (see FIG. 4).

The gain amp/buffer IC amp 42B (parts 1 and 2) provides high gain (e.g. in the range of 25-100 V/mV and is powered by external power (e.g. ±3 V to ±20 V) via a dedicated "amplifier voltage" line. External power can be supplied as discussed above and as further discussed regarding external power supply 71 herein).

One example of a possible IC is Model No. NE5534a from Mouser Electronics of Mansfield, Tex., USA.

Note that in this example, a rheostat or analogous device (see caption "pre amp gain" 200) allows some range of manually-controlled variation of gain by varying resistance of the inverting input.

3. Line Driver Stage

The line amp IC 42C provides gain (e.g. in the range of 25-100 V/mV) and is powered by external power (e.g. ±3 V to ±20 V) via a dedicated "amplifier voltage" line.

One example of a possible IC is Model No. NE5534a from Mouser Electronics of Mansfield, Tex., USA.

Note that in this example, a rheostat (see caption "output fader" and ref no. 42E) allows some range of manually-controlled variation of gain by infinity to unity gain.

4. Output Stage

An output transformer 42D is used to isolate the circuit from possible downstream damage and match impedances to equipment following, isolate, create or adjust tonality, is part of the overall gain scheme of the unit.

5. Housing

Similarly, the microphone assembly has a single housing of the various mic stages described above. Appropriate cabling and connectors are used.

E. Specific Example 3 (Solid State-Based) (FIG. 5)

1. Input Stage

The input stage sound transducer/capsule 52A can be as described with Specific Example 1 above.

2. Buffer Stage

The buffer 52B and line driver 52C can be implemented with discrete solid state components. In this example, the buffer stage 52B includes discrete solid state components as shown in FIG. 5. Additional circuit components (e.g. resistors, diodes, capacitors, etc.) can be configured to produce the desired high gain buffer function of this stage.

The gain amp stage provides high gain (e.g. in the range of 0 to 30 decibels) and is powered by external power (e.g. +/−16 to +/−48 V) via a dedicated "amplifier voltage" line. See discussion elsewhere regarding external power supply for this purpose.

Figure 5:
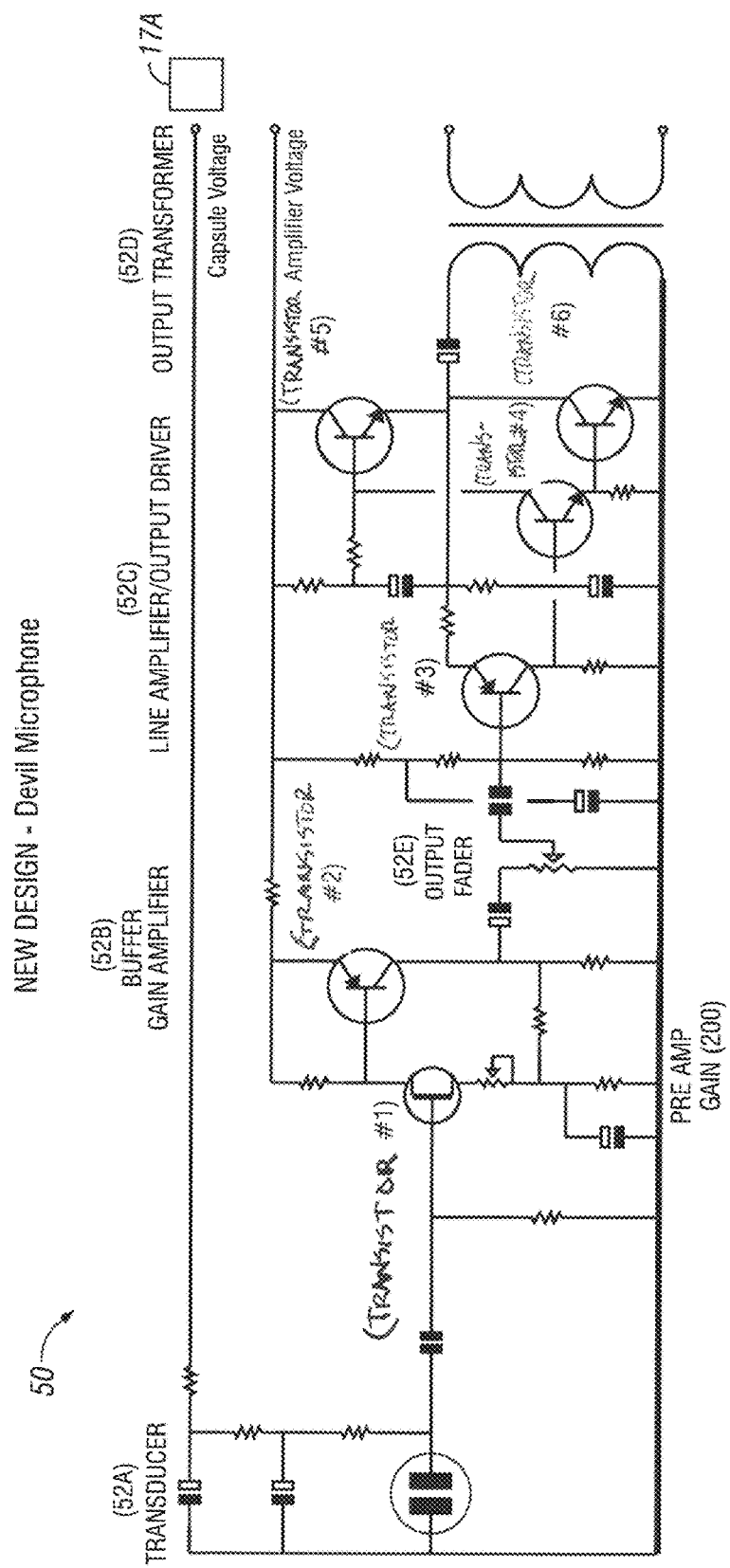
FIG. 5 is a diagrammatic depiction of a third exemplary embodiment of the present invention.

As shown in FIG. 5, the stage can include FETs/transistors in the configurations indicated. Examples are:

Transistor #1 from left: Model No. 2n3819 (FET) from Mouser Electronics of Mansfield, Tex., USA.

Transistor #2 from Left Model No. BC560c from Mouser Electronics of Mansfield, Tex., USA.

Note that in this example, a rheostat or analogous control (see caption "pre amp gain" 200) allows some range of manually-controlled variation of gain.

3. Line Driver Stage

The line amp/output driver stage provides gain (e.g. in the range of 10 dB) and is powered by external power (e.g. 16 to 48 v) via a dedicated "amplifier voltage" line.

Examples of possible components are:

Transistor #3 from left Model No. BC560c from Mouser Electronics of Mansfield, Tex., USA.

Transistor #4 from left Model No. 2n1711 from Mouser Electronics of Mansfield, Tex., USA.

Transistor #5 from left Model No. 2n3055 from Mouser Electronics of Mansfield, Tex., USA.

Transistor #6 from left Model No. 2n3055 from Mouser Electronics of Mansfield, Tex., USA.

Note that in this example, a rheostat (see caption "output fader" 52E) allows some range of manually-controlled variation of gain.

4. Output Stage

An output transformer 52D is used to match impedances to equipment following, isolate, create or adjust tonality, is part of the overall gain scheme of the unit.

5. Housing

Similarly, the microphone assembly has a single housing of the various mic stages described above. Appropriate cabling and connectors are used.

Figure 6:
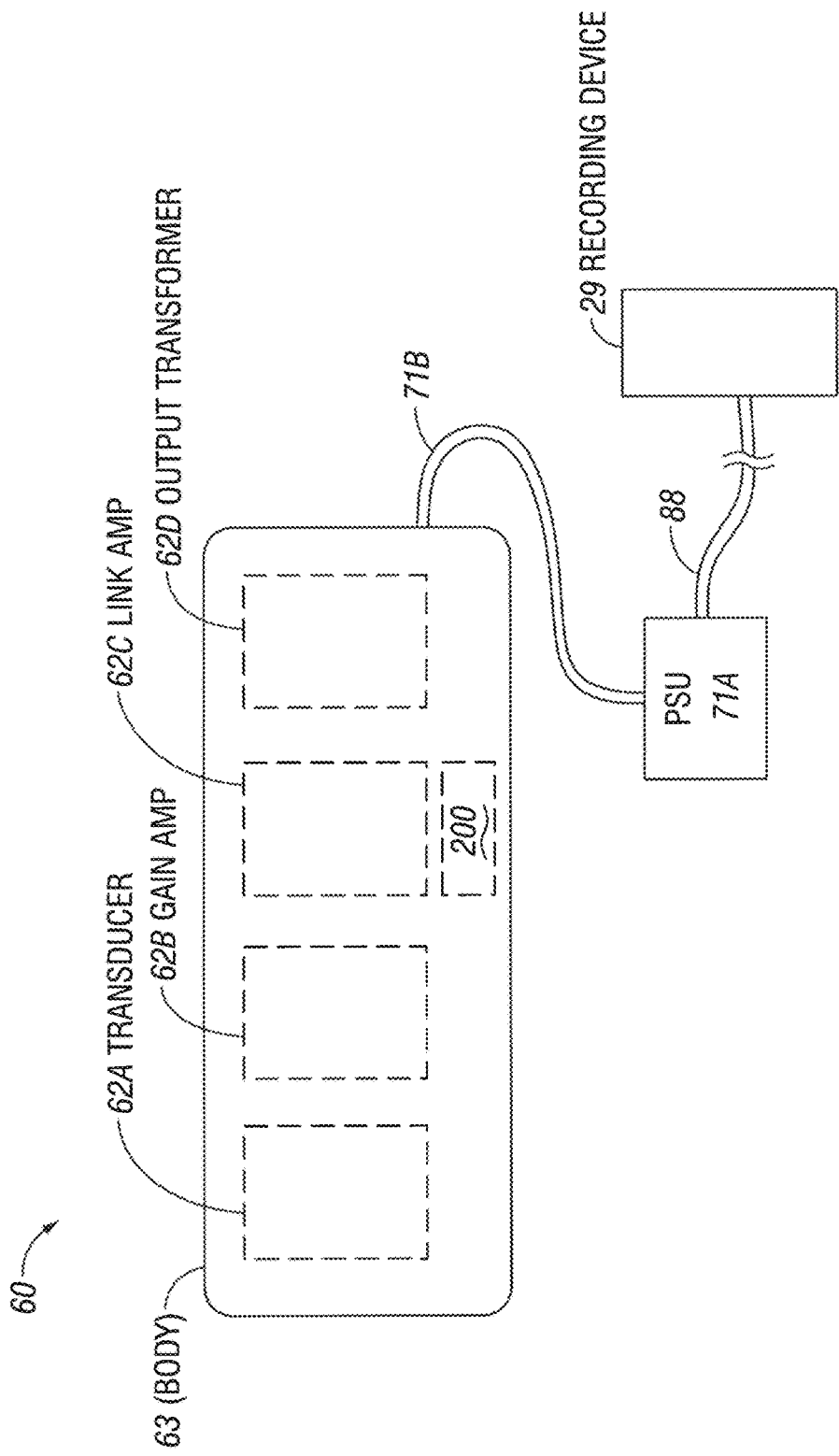
FIG. 6 is a high level diagrammatic depiction of an aspect of the present invention.

F. Generic Example (Mic Body with External Power Supply Unit PSU) (FIG. 6)

1. Input Stage

The import sound transducer/capsule 62A can be as described with other examples.

2. Buffer Stage

The circuit of FIG. 6 is internal in a microphone 60 having a microphone body such as could be similar to the other embodiments (capsule 62A, gain amp 62B, line amp 62C, output transformer 62D). This embodiment utilizes a single vacuum tube in comparison to that of FIG. 3. See reference numeral 60B. This represents a large savings for the user and designer in terms of size, cost, heat output, and simplicity of design and build. However, it maintains benefits similar to other embodiments in that it can be integrated or built into a single hand-held microphone housing or body. An output section 620D allows connection to a recording device such as the other embodiments. An external power supply 71, such as discussed with other embodiments, provides power to the capsule 62A. Like other embodiments, it could include a gain adjustment.

G. Specific Example 5 (Kit of Mic, External Power Supply, Cables, Mic Shock Mount, and Carrying Case) (FIGS. 8A-10A through 10C)

By specific reference to FIGS. 8A-D, 9A-H, and 10A-C, another exemplary embodiment is illustrated.

Microphone 80 can include any of the specific examples of FIG. 3-5, or other analogous internal circuit configured to plug in directly to a recording device as described in the other examples. FIGS. 8C and D provide alternative body styles 80 and 80'. In some cases, the internal circuit can be compact enough that it can fit within the short body form factor of FIG. 8D. In other implementations, it may require a longer body such as FIG. 8C. These are nonlimiting examples both as to size, proportion, and configuration. See also FIGS. 11D-H for specific dimensions. For example, the single tube-based circuits of FIGS. 4 and 5 may fit in a shorter bodied mic.

As illustrated in FIGS. 8A and B, one aspect of the invention is the ability to have a kit of mic 80, power supply 71A and its connecting cord or cable 71B to mic 80. A cable 88, which can be very long, is connectable between power supply 71 and any of a variety of recording devices. Optionally, a shock mount 211 can be in the kit but is not necessarily required. A portable carrying case 212 sized to contain the kit is also possible.

This allows a microphone system to be portably carried from location to location with all essential components for that particular microphone use. As indicated in FIG. 8B, shock mount 211 would be specifically configured for the form factor of microphone 80 and attachable to a mic stand 210 (see, e.g., FIG. 8B) or other elevating support (e.g. boom or other supporting structure). Power supply 71A can be connected locally via cord 71B to mic 80 and either have a cord to plug into mains power at whatever facility is involved. In some cases, battery power inside supply 71A may be possible.

Cable 88 can be tens of feet long if needed so that it can have high flexibility regarding reaching and connecting to a recording device which could be more remote from stand 210. Thus, power supply 71A is local to mic 80 and requires a relatively short cord 71B. The kit can contain a relatively longer cord 88 for flexibility in reaching different distances to a recording device 19. This also allows flexibility and where mics and musicians want to be.

FIGS. 9A-9H show some specific features of microphone 90. In these figures, microphone 90 can be similar to microphone 80 in that it can house any of the preceding specific examples. Its body 92 can be on the order of around a foot in length, and around several inches in diameter. A cylindrical form factor includes a transducer (e.g. 12A) at one end surrounded by a screen for acoustic permeability to the transducer. The other end can include the connection ports for external power supply cord 71B and recording device cord 88.

FIGS. 9A and 9C shows specific exemplary controls on mic body 92. Toggle switch 93 labeled "type" can switch between two states namely "normal" and "drive". The difference between the two is as follows.

Toggle switch 94 labeled "pole" has two states. This allows immediate and local control of these types of functions at mic 90.

The opposite side (FIGS. 9B and 9D) of the lower part of body 92 can include a rotary switch 95 with adjustable gain. It is important to note that this provides an immediate, local gain adjustment right at mic 90 instead of at a preamp or a mixing counsel.

FIGS. 9E-H show additional user controls and their functions. In this example, there are toggle switches 96 and 98 on opposite sides near the top of body 92 that is near the screen around the transducer.

Figure 9H:
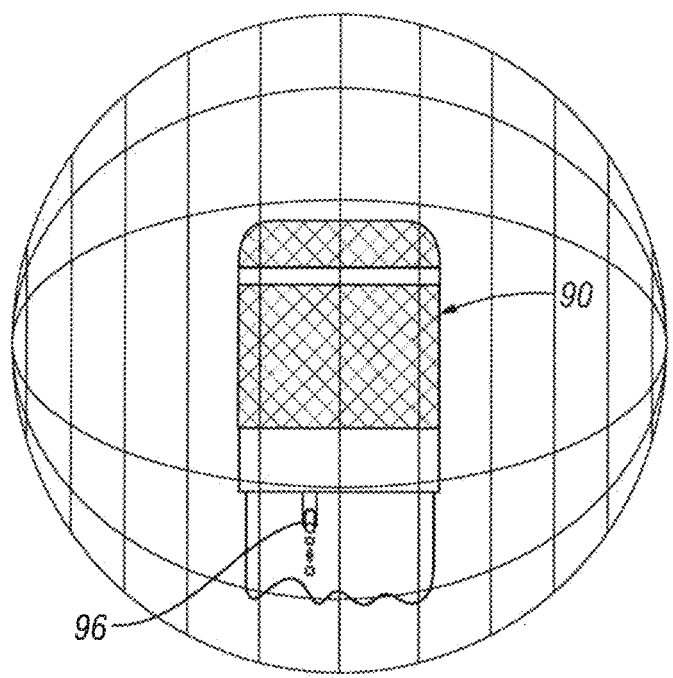

As indicated in FIG. 9E, one toggle switch 96 can allow switching between at least two states where the extremes are cardioid polar pattern/directionality sensitivity to incident sound and on the directional. These are well known in the art. FIG. 9G gives a diagrammatic depiction of toggle switch 96 in the up or first position for cardioid sensitivity. FIG. 9H is a diagrammatic depiction for the switch 96 in an opposite position for and on the directional sensitivity.

It can therefore be seen that in embodiment 90 the user has a variety of local control options for mic set up and performance.

H. External Power Supply Example (FIGS. 10A-10C)

With specific reference to these figures, one example of an external power supply 71A is shown. As indicated in FIG. 10A, it can be of easily portable size with carrying handle 103. It can include an "on" indicator light. Its case or housing 102 can be on the order of several inches in height and width and perhaps a foot or so in depth or length.

FIG. 10B further indicates there can be plural output ports 104 and 105 (or more), although one may be all that is needed for a cord to microphone 90. But the option of a variety of ports can provide flexibility regarding connectors. It also would make the power supply available not only for mic 90 but other components if needed.

Another feature, over and above being an external and portable power supply 71A for mic 90, is auxiliary controls can be included. One example is contour control rotary dial 106 at FIG. 10B.

FIG. 10C illustrates supply 71A on its opposite side can include port 107 for connection to electrical wall outlet for AC power. An on-off switch 109 which would turn on the "on" indicator light on the front panel. A fuse 108 can also be included such as is desirable or required for power supplies.

It can be appreciated that the basic primary function of providing electrical power to the microphone for operation of the internal components is relatively simple and inexpensive such that a power supply such as this can be provided for each microphone in many if not most situations.

I. Thermal Management

As is known in this technical field, the sensitivity of most microphone transducers to sound energy also makes them sensitive to other forms of energy. One is mechanical energy. Thus, in many situations the shock mount such as 211 is utilized to mechanically isolate the microphone, or at least "dampen it" from physical vibration through whatever it is mounted to.

Another factor is thermal energy. It has been found that, by integrating the components as suggested in many of the embodiments of the present invention into a single microphone body or housing, thermal management issues may exist. It is also beneficial to attempt as is possible electromagnetic shielding or encasing as many components as possible. This is again to protect them from a variety of forms of energy as well as from environmental factors such as moisture, dust, and the like. However, a housing that encases its components can trap or allow buildup of heat inside. That heat could adversely affect the sensitivity or operation of the transducer or other system components.

According to aspects of the invention, FIGS. 11A-H, in conjunction with FIGS. 9E and 9F, illustrate several thermal management optional features that could be implemented with any of the embodiments.

Extra heat created by additional microphone and amplifier circuitry in the body should ideally be controlled. This is to avoid degradation of the transducer over time, and to reduce wear of components inside the microphone body.

In one example, microphone 100, which could be the same as or similar to any of the examples 20, 30, 40, 50, 60, 70, 80, or 90, could have one or more essentially thermal vents in the body to allow escape of heat.

One example would be to use on-body controls such as toggle switches 96 and 98 of FIGS. 9E and 9F as part of thermal management. Instead of extending toggle switches 92 and 98 from slightly outside the exterior periphery of mic body 92 or covering slots into the mic body 92 to seal any air exchange to interior 115 (See FIG. 11B), toggle switches 96 and 98 could be basically recessed through unsealed slots 97 and 99 in mic body 92. The distal ends of the toggle portions 96 and 98 would be at or near the perimeter outside surface of the mic body 92. But their slots 97 and 99 present a passageway or vent in communication through mic body 92 sidewall 114 with the interior 115 of the mic body 92. This can allow heat to escape and provide passive thermal management through this dual use of on-body mic controls.

FIGS. 11A and B illustrate this diagrammatically. In FIG. 11A, the example of using the switching features of the microphone to double as heat control is shown. Recessed toggle switches 96 and 98 are accessible through slots 97 and 99 in sidewall 114 of the mic body to control both the microphone PAD and its switchable pickup patterns as described earlier. Body slots 97 and 99 double as heat control by essentially being vents to thermal energy as illustrated by the arrows emanating from them in FIG. 11A.

One way to build this configuration is shown at FIG. 11B. A cylindrical shell or sidewall 114 would define the interior 115 for the circuits described regarding these types of microphones. In order to intentionally try to trap heat in interior 115, a bottom plate or sub-assembly 116 that can be sealingly mounted at one end of cylinder 114 can seal the lower end of the mic body 92. A top plate 117 can basically seal the top of cylinder 114. It can also have a robust mount 118 to mount the sensitive transducer 12A inside microphone body 92.

Slots 97 and 99 can be formed at or near the top of cylinder 114 and allow positioning of the toggle switches 96 and 98 when all the circuitry is assembled. But those slots 97 and 99 can be big enough to both allow access (e.g. via a small screwdriver or other tool) to control the toggle switches but also have open areas around them in communication with the interior 115 of cylinder 114. As shown in FIG. 11B, heat generated in interior 115 (see large wavy arrow) could then escape to cooler ambient surroundings through those slots (see arrows inside interior 115 pointing to the slots and then the arrows showing escape of heat through the slots to the exterior ambient air).

A subtlety is that capsule mounting plate 117 fits snugly within the microphone body 113 to essentially seal interior 115 from transducer 12A. It also forces hot-air away from capsule 12A and out through the venting as indicated by the arrows.

As will be understood, this subtlety actually counterintuitively tries to trap heat. But it uses the arrangement to promote heat movement out of the body 92 and keep it away from the capsule 12A. Under the laws of physics, this passive heat management relies on thermal equilibrium. If heat builds up inside mic body 92 to a higher temperature than surrounding ambient air, equilibrium will be sought, which would tend to transfer heat out and bring the interior temperature towards the outside ambient temperature.

FIG. 11C shows an additional example of heat management. It could be used by itself or in combination with the slots of FIGS. 11A and 11B. Additional venting 119 could be added anywhere on the microphone body as needed. The designer would balance, however, the desire to keep as much electromagnetic and physical shielding of the internal circuitry in the mic body as possible. Therefore, in some situations the designer may have no openings for heat management. One or more toggle switch and slot heat vents might be used. One or more single slot or multi-slot vents 119 might be used.

FIGS. 11D-H show more details about how microphone body 90 could be configured, including the toggle switch vents described above. It also illustrates one example of dimensions for one form factor of the mic body. As will be understood, this could vary according to need or desire.

FIG. 12 illustrates another optional heat management technique. As mentioned above, extra heat created by additional microphone and amplifier circuitry in the microphone body desirably should be controlled. Again, this is to avoid degradation of the transducer and wear on circuit components inside the microphone.

One optional additional possibility or technique for heat management is to relocate any components that create what might be considered excessive heat inside the microphone body to the external power supply that accompanies the microphone. In one example, this could be large transistors, tubes used for power regulation, or high wattage resistors used for voltage control. See, as nonlimiting examples, reference numerals 128A, B, and C in FIG. 12. Those three components would be shifted from inside the mic body to inside the external power supply, and thus remote from the mic transducer. This leaves the pre-amp and line driver in any of the embodiments still in the microphone body, although any of these components could be relocated into remote power supply 71A housing 102. If needed, transistors and tubes for the line driver section could even be relocated but at the cost of increased signal path. The designer could select what is best for a particular setup or application.

Additionally, similar to venting 119 on mic body 92 mentioned earlier, venting (see arrows in FIG. 12) such as 129 could help thermal management in external power supply 71A. Any amount of venting can be applied according to need or desire as electromagnetic shielding here is less important in many circumstances.

J. Gain Control Options

With reference to FIG. 13, another possible optional feature that could be used with any of the embodiments, or at least many of the embodiments, is illustrated.

Local control (at or near the mic) of gain can be beneficial. Gain can be controlled in a number of ways. In the microphone body, the most direct way of controlling gain in the system is by placing a potentiometer or precisely calibrated switch on the body of the microphone. In keeping with system objectives, the signal path is kept as limited as possible, including in many of these implementations being mere inches.

Gain control of the circuits would usually be accomplished by means of feedback. In the case of tubes from the plate of line driving tube to cathode of the gain and buffer sections as in a preamp design.

Alternative gain control could be for gain control to function as a counsel fader or preamp output control. In this case, the potentiometer or switch 132 could be placed between gain stages or at the output of the entire system as shown in the circuit diagram of FIG. 13.

Either version of these types of gain control 134 can also be placed on remote power supply as chosen by designer and requirements of the individual system (see FIG. 13). This is a natural spot for the fader type control if the system output has been placed on the remote power supply as a high level, amplified signal will be present at this location.

It should be noted that both types of gain control can be used. This can be done to allow the user flexibility in gain staging the system and creation of textures. For example, the input of the system could be driven to produce harmonically rich textures while the fader is reduced to allow proper output level without distorting the recorder. Conversely, the input could be run at lower levels to create pure transmissions and the output is set to full for maximum head room and fidelity. These are options that no microphone system at present can provide.

K. Transducer Options

As shown by diagrammatically at FIG. 14, it is to be understood that not all microphones can be built with a variety of transducer types. The most common being condenser, ribbon, and dynamic. One optional technique that can easily be implemented with any of the above variations by a designer knowledgeable in this technical area is any of the transducers type shown in FIG. 14 could be implemented in the circuit topologies described herein. Each of these transducer types 142A-D are available in various sizes and types with variations in construction material that can be manipulated to achieve the designer's desired effect.

L. Supplemental Information About Microphone 80/90 and External Power Supply (Sometimes "Power Supply Unit" or "PSU")

In the case of a microphone according to microphone 80 or 90 above, one specific exemplary embodiment is discussed in further detail below. It will be seen how it meets one or more features of the present invention.

The REDD™ Microphone (commercially available from Chandler Limited, Inc., Shell Rock, Iowa USA; see http://chandlerlimited.com/redd-microphone/as of 20170919; REDD™ is a trademark of EMI (UK)) is a large diaphragm tube condenser microphone, combining mic and preamplifier into the microphone body. Featuring the vacuum tube based REDD.47 Mic Amplifier circuit coupled directly to a custom handmade premium platinum membrane capsule, the REDD Microphone can be used with or without an external preamp.

The proximity of the REDD Microphone's custom capsule to its internal REDD.47 mic preamp circuit, creates the shortest possible path between the two most important elements in the recording chain, delivering a larger than life full-bodied sound, with a silky smooth top-end.

Features available from the microphone body, include: 9 gain selections, +4 to +33 db in 'NORM', extended gain and punch in 'DRIVE', Cardioid/Omni patterns, 10 db Pad, and Phase. Continuous output control and low-contour voicing features are accessible from the high-quality external power supply.

This exemplary embodiment, e.g. the REDD Microphone, represents a shift in traditional microphone design, bringing together historic circuitry and pre-amplifier sound in a new and unique way.

The REDD Microphone is a large diaphragm tube condenser microphone, featuring a dedicated internal REDD.47 Mic Amplifier circuit.

The REDD Microphone system includes: microphone, 7-pin microphone cable, power supply and AC cord, shock mount suspension apparatus, pattern select screwdriver, and custom moulded flight case.

The REDD Microphone, featuring its on-board REDD.47 pre-amplifier circuit, is contained in a cylindrical metal assembly, directly coupled to a premium custom made, hand-milled, platinum membrane capsule, housed in the chrome head-basket compartment.

The close proximity of capsule to microphone pre-amp provides the shortest possible distance between microphone capsule and pre-amplifier, allowing the REDD Microphone to drive the line from the source, rather than the end. The all-in-one approach reduces electronic circuitry in the audio path, and allows for high-grade audio transmission from the source.

The REDD Microphone was designed to plug directly into audio interfaces or tape machines, however, can be used with traditional external pre-amplifiers for more tonal possibilities.

Technical features are set forth in Table 1 below.

TABLE 1

REDD MICROPHONE TECHNICAL SPECIFICATIONS

| | |
|---|---|
| Microphone Type | Large Diaphragm Condenser, Tube |
| Capsule | Platinum membrane, custom handmade, hand-milled |
| Circuit | REDD.47 Mic Amplifier, Tube, 200Ω output impedance |
| Gain | Switchable/+4 to +33 db in 'NORM' mode |
| Maximum gain | Extended gain in 'DRIVE' mode |
| Patterns | Cardioid/Omni |
| PAD | 10 db/Switchable |
| Phase | 0-180°/Switchable |
| Low-Contour Control | Available at PSU |
| Output Control | Continuous/Available at PSU |
| Power | External/PSU included |

TABLE 1-continued

REDD MICROPHONE TECHNICAL SPECIFICATIONS

| Microphone Type | Large Diaphragm Condenser, Tube |
|---|---|
| Microphone Cable | 7 Pin, 25' Mogami, included |
| Shockmount | Included |
| Case | Molded flight case/custom cut high-density rigid foam, included |

One example of set up for operation is at Table 2.

TABLE 2

IMPORTANT QUICK START & POWER CYCLE PROCEDURE

1. Mount the microphone to a suitable microphone stand using the supplied shock mount suspension apparatus.
2. PRIOR TO POWER-UP—CONNECTIONS
   a. Connect the microphone to power supply using the supplied 7-pin microphone cable.
   b. Connect the user supplied standard 3-pin XLR microphone cable to the audio interface or tape machine.
   c. Connect the power supply to an AC outlet.
3. POWER-UP
   a. Once all connections to and from the power supply to the microphone have been made, turn on the power supply, by means of the power switch located at the rear of the PSU.
   b. If power has been achieved, the microphone's on-board LED, located inside the head-basket, will illuminate red to signify the microphone is active. The LED is also used to help align the capsule to the sound source.
   c. WARNING—Do not disconnect the 7-Pin microphone cable while AC power is applied to the microphone. If disconnection is to be made, power down the microphone, and allow 5-10 minutes of cool-down time prior to disconnection of the 7-pin microphone cable from the power supply. NOTE—3-pin XLR audio output connection may be patched or unpatched as necessary, without powering down.
4. WARM-UP TIME
   a. Prior to sound incident or usage, allow the microphone's tubes to warm-up for a minimum of 10 minutes.
5. POWER DOWN
   a. Prior to disconnecting the 7-pin cable, power down the PSU, and allow 5-10 minutes for the microphone's internal tubes to cool down and the capsule adequate time to discharge. NOTE—It is recommended to power down the REDD Microphone when not in use.

Specifics about the on-board controls are as follows:

ON-BOARD MICROPHONE CONTROLS

A. PRE AMPLIFIER

The dedicated on-board REDD.47 Mic Amplifier (pre-amplifier) circuit provides the ability to use the REDD Microphone with or without the need for an external pre-amp. The preamplifier and most of its available features are adjustable directly from the microphone body.

1. GAIN

NOTE: Adjust this switch for the desired amount of input gain, stepped, from +4 to +33 db The on-board microphone pre-amplifier gain setting is adjustable at the rear of the microphone. There's nine gain settings to choose from, including: +4,8,12,16,24,27,30,33 db. The resultant effective gain is also dependent upon the 'NORM' vs 'DRIVE' mode setting; selection of either 'NORM' or 'DRIVE' mode is available via toggle switch from the front of the microphone body, and have a tonal effect on the microphone signal.

2. TYPE

NOTE: Use this switch to select between 'NORM' and 'DRIVE' modes. 'Drive' boosts the microphone's internal REDD.47 preamp for additional character and punch.

a. NORM

When the toggle switch is set to 'NORM,' the REDD Microphone pre-amplifier is considered in its normal operational condition. The sound characteristic in this state, is more organic or natural, or laid-back in comparison to 'DRIVE'.

b. DRIVE

The 'DRIVE' setting has an overall effect over the adjustable gain range, both in terms of structure and more importantly, harmonic content. It is similar to the 'FINE GAIN' on the REDD.47 Mic Amplifier rack-mount counterpart, however, set fully on and non-variable.

When set to the 'DRIVE' position, the tonal effect on the microphone signal is identifiable, characterized as being more immediate, punchy and present. The resultant tonal change is also interactive and dependent upon the gain setting.

Depending upon the sound incident level and gain setting, 'DRIVE' mode, if driven hard enough, can impart wonderful harmonic coloration and tube saturation with a little characteristic 'hair' on a signal.

3. POLE

In cases where phase continuity relative to other microphones in the environment is required, an 180° polarity reversal of the output signal is achieved by use of the 'POLE' or phase reverse toggle switch available from the microphone body.

When the toggle is set outward, to the circular or 'O' designation, phase is in its natural position at 0°. Conversely, when the switch is positioned to the left at the 'ø' designation, phase is reversed 180°.

4. POLAR PATTERNS

NOTE: Use this toggle switch to select between Cardioid or Omni Polar patterns. The directional characteristic of the REDD Microphone is selectable. Two polar pattern options are provided, Cardioid or Omni-directional, either is available via toggle switch from the microphone body, using the supplied pattern select screwdriver.

a. CARDIOID

This unidirectional polar pattern discriminates against source arriving at the rear of the capsule, and to a lesser degree at the sides, in preference for sound incident at the front of the microphone.

Proximity effect is a natural occurrence of the Cardioid polar pattern, where low-end is emphasized when the sound source is closer to the microphone.

TIP—If in Cardioid, the microphone is required to be placed in close proximity to a source, such as acoustic guitar, where capture of low frequency data is less desired, or in small environments where natural build-up can occur, use the 'LOW-CONTOUR' feature as an alternate microphone voicing; See 'LOW-CONTOUR' control section. If Cardioid is not required, and 'LOW-CONTOUR' is unnecessary, the Omni pattern can be used to diminish proximity effect.

TIP—Use the Cardioid pattern in scenarios where minimal pickup at the rear of the microphone is needed.

b. OMNI

The omni-directional polar pattern is spherical, picking-up from all sides of the capsule, e.g. the pattern is indiscriminate to the direction of sound incident.

Proximity effect is not a feature of the Omni pattern, and as a result, an apparent drop in lows (and gain,) is a normal byproduct of this setting.

TIP—Use Omni where a sense of space is apropos, for example, strings, acoustic guitars, pianos or other material, or a more natural distribution of low-end is preferable.

5. PAD

NOTE:Use this switch to engage (or disable) the 10 db PAD.

Facility to decrease sensitivity of the microphone by −10 db exists, and is made available from the microphone body via toggle of the PAD switch to the downward position, using the supplied pattern select screwdriver.

TIP—Use the PAD feature in scenarios where the sound incidence is overloading the capsule.

Specific regarding the power supply and its controls is as follows.

POWER SUPPLY & AUXILIARY CONTROLS

The power supply (PSU,) supplied with the REDD Microphone kit is wired localized for regional AC, either 110V or 220V (115/230V, depending upon country of purchase. A REDD Microphone kit purchased in a region where AC is 110V (115V) standard cannot be used in 220V (230V,) unless it is modified for the correct operating voltage or an external power converter is used. NOTE: Some external power converters.

A. PSU REAR PANEL

1. AC POWER

At the rear panel of the PSU, exists a standard male IEC connector for connection to AC power, using the supplied IEC cable.

Also at the rear PSU panel is bayonet style fuse compartment. For fuse replacement procedure and value, please reference the maintenance section of the manual.

2. POWER SWITCH

The master power switch is located at the bottom left of the PSU rear panel and labeled ON/OFF. Once all connections, to and from the microphone to the PSU have been made, flip the power switch to supply mains power to the microphone. NOTE: The microphone head basket will illuminate, signifying power is on.

B. PSU FRONT PANEL

1. MIC INPUT

The top receptacle is a 7-pin female jack. Plug the supplied 25' (762 cm) 7-pin microphone cable here, and attach the female end of the cable to the microphone base connector.

2. LINE OUTPUT

The bottom receptacle is a standard 3-pin male XLR jack. This output jack supplies analog line level signal to your audio interface converter, tape machine, or other external audio processor; the source (output) impedance is 200 ohms.

3. OUTPUT CONTROL

The 'OUTPUT' control is continuous, acting as a fader would on a console, and is used to reduce the overall output of the REDD Microphone; this control is functionally the same as the REDD.47 Mic Amplifier rack-mount.

In most applications, attenuating the output of the microphone signal maybe unnecessary and should be left fully clockwise at unity or '0'. However, if reduction of the overall output signal is required, simply rotate the 'OUTPUT' control counterclockwise until the level desired level is achieved.

TIP—On drums room application, if a driven sound with tube saturation is the goal, turn up the gain, engage 'DRIVE' and turn down the 'OUTPUT' to not clip your converter's input.

The 'OUTPUT' control is operational regardless of the 'PULL FOR LOW CONTOUR' feature being actuated or not.

a. LOW-CONTOUR

The 'LOW-CONTOUR' function is an alternate voicing of the REDD Microphone, it features a tighter sound with top-emphasis and is an excellent choice for many sources.

'LOW-CONTOUR' is available from the power supply (PSU,) to actuate the 'LOW-CONTOUR' voicing, simply pull the 'OUTPUT' control potentiometer outward; the 'OUTPUT' control is still fully operational.

TIP—In recording scenarios and environments, where a more top-emphasized sound and a tailored low-end may be desired, the 'LOW-CONTOUR' voicing is well suited for this purpose.

One example of form factor and features are set forth in Table 3.

TABLE 3

| ITEM | DESCRIPTION | DIMENSIONS | WEIGHT |
| --- | --- | --- | --- |
| Microphone | Tube, Large Diaphragm Condenser | 10.97(L) × 2.46(W) in (278.64 × 62.48 mm) | 1.11 lb/ 0.504 kg |
| Capsule | Platinum membrane, custom handmade, hand-milled | X | X |
| Circuit | REDD.47 Mic Amplifier, Tube ×2 | X | X |
| Gain | Switchable/to +33 db in 'NORM' mode | X | X |
| Maximum gain | Extended gain in DRIVE mode | X | X |
| Patterns | Cardioid/Omni | X | X |
| PAD | 10 db/Switchable | X | X |
| Phase | 0-180°/Switchable | X | X |
| Power supply | External PSU, AC set internally for region, included | 11.4(L) × 4.04(W) × 4.81(H) in (289.56 × 102.62 × 122.17 | 5.02 lb/ 2.28 kg |
| Low-contour control | Preset, switchable | X | X |
| Output control | Continuous, 200Ω out-put impedance | X | X |
| Fuse | ½ AMP, 250 V SLO-BLO | X | X |
| Accessories | | | |
| Microphone cable | 7 Pin, Mogami (Neglex 3172,) included | 25' (7620 mm) | X |
| Ac cable | Type IEC, included | 6' (1828.8 mm) | X |
| Shockmount | Included | X | X |
| Pattern select screw-driver | included | X | X |
| Case | Molded flight case, included | 21.85(L) × 8.31(W) × 16.85(H) in (555 × 211 × 428 mm) | 20 lb/ 9.07 kg, loaded |

M. Other Options

As previously mentioned, variations obvious to those skilled in the art will be included with the invention. Some of those have been mentioned above. Further examples are set forth below.

1. Housing

A variety of form factors can be used. As a general rule, it can be beneficial that the housing be at least similar in form factor to existing professional audio mics both for portable, hand-held ability, and familiarity with musicians, but also to interface with existing mic stands or holders.

The form factor can be selected by the designer. The factors a designer typically would consider would include:

a. head or grille of microphone, properties of can affect the overall sound of the mic;
b. body shape or shell;
c. base;
d. connector for power and audio.

2. Capsule

A few non-limiting examples are:
a. dynamic (does not require phantom voltage);
b. condenser (can require phantom voltage);
c. electret (requires voltage);
d. ribbon (does not require voltage).

3. Buffer/Line Driver/Output Stages

The description above gives examples of each. Variations obvious to those skilled in the art will be included.

4. Faders

Use of either the pre amp fader or the output fader are optional.

5. Transformers

The specific make up of any of the transformers can vary according to the designer's needs or desires. Those skilled in the art would understand the factors which include impedances, inductances, resistance, transformer lamination construction and variation, winding styles and variations.

As will be appreciated by those skilled in the art, the types and values for some of the components in any of the three specific exemplary embodiments can vary according to desire or need. For at least some implementations of any of the tube, IC, or discrete solid state versions, the designer could design and create customized components and/or sub-circuits. For example, transformers, transducers, transistor application, and tube application can be customized or created to meet desired operating characteristics according to the design rules discussed above.

As can be appreciated from the foregoing, aspects of the invention can be embodied differently for different needs and desires. The designer utilizes the same fundamental idea of essentially integrating a preamp into the microphone body with appropriate other components to allow direct plug in to a recording counsel via the use of in addition, an external power supply to the mic. (See, e.g., FIG. 6) The overall configurations allows different versions of such circuitry to be integrated in the microphone housing. Various options and features described above can be included according to desire or need.

As further indicated by the examples, whether called stages or components, the reader will understand that there is flexibility in implementing the general concept regardless of how those are denominated. In other words, in its basic form, a transducer with sound is needed and at least the preamp type circuitry or components with some sort of output stage. External power is also utilized to the mic.

Also, as shown, connection cords can vary. FIG. 7 shows one possible arrangement. FIG. 8B shows another, where one cord 71B (can be local and relatively short) is between mic 80 and PSU 71A; and second cord 88 (can be relatively long) is between PSU 71A and recording device 29.

The invention claimed is:

1. A high fidelity microphone comprising:
   a. a microphone capsule to transduce sound from acoustic energy into an electrical signal along a signal path;
   b. an internal pre amp circuit comprising:
      i. a gain amp and buffer stage directly operatively coupled within inches along the signal path to the microphone capsule, the gain amp and buffer stage comprising a variable gain amplifier with (1) an impedance of at least 1 gigohm and (2) an overall available voltage gain of on the order of 30-40 dB;
      ii. a line amp/output driver stage operatively coupled to the gain amp and buffer stage along the signal path;
      iii. a connection operatively connectable to an external power source;
      iv. an output stage operatively coupled between the line amp/output driver stage and a connector comprising a cable having a length of inches to hundreds of feet adapted for connection to provide a microphone output signal at the output stage along the signal path to any of:
         1. an analog recorder;
         2. a digital recorder; or
         3. an external mixing console;
      v. a user-adjustable gain control operatively coupled to the variable gain amplifier allowing local user switching between a plurality of gain levels over a range of gain levels including during use of the high fidelity microphone;
   c. wherein the internal pre amp circuit:
      i. reduces the signal path distance between the microphone capsule and the variable gain amplifier to improve reproduction of transduced sound;
      ii. allows adjustable gain at the gain amp and buffer stage by the user-adjustable gain control to reproduce with high fidelity a range of input acoustic energy without distortion.

2. The high fidelity microphone of claim 1 wherein:
   a. the microphone capsule comprises a large diaphragm condenser with a platinum membrane.

3. The high fidelity microphone of claim 1 wherein the internal pre amp circuit provides approximately 30-40 dB of available overall voltage gain.

4. The high fidelity microphone of claim 1 wherein gain is spread substantially evenly between the gain amp and buffer stage and the line amp/output driver stage.

5. The high fidelity microphone of claim 1 wherein the gain amp and buffer stage comprises both a buffer and the variable gain amp.

6. The high fidelity microphone of claim 1 wherein the microphone capsule and internal pre amp circuit are mounted in a housing.

7. The high fidelity microphone of claim 6 wherein the housing is a hand-held size microphone housing.

8. The high fidelity microphone of claim 7 wherein the output stage further comprises one or more of an output fader and an output transformer.

9. The high fidelity microphone of claim 1 wherein the gain amp and buffer stage and the line amp/output driver stage comprise analog tubes.

10. The high fidelity microphone of claim 9 wherein the analog tubes comprise a pentode for the gain amp and buffer stage and a triode for the line amp/output driver stage.

11. The high fidelity microphone apparatus of claim 1 wherein the gain amp and buffer stage and the line amp/output driver stage comprise integrated circuits.

12. The high fidelity microphone of claim 11 wherein the gain amp and buffer stage and the line amp/output driver stage comprise field effect transistors (FETs).

13. The high fidelity microphone of claim 1 wherein:
   a. the user-adjustable gain control at the gain amp and buffer stage comprises one or more of: (1) a plurality of steps of gain; (2) an extended gain; and (3) a punch gain;
   b. the line amp/output driver stage comprises a valve which controls voltage and current.

14. The high fidelity microphone of claim 13 wherein the controlled voltage and current are effective to produce high fidelity for the microphone output signal.

15. The high fidelity microphone of claim 1 wherein the gain amp and buffer stage is within one to two inches of the microphone transducer in the signal path.

16. The high fidelity microphone of claim 1 wherein the internal pre amp circuit provides the microphone output signal for:
   a. analog recorders;
   b. digital recorders; and
   c. mixing consoles.

17. The high fidelity microphone of claim 1 wherein the connector comprises a cable having a length of tens of feet to hundreds of feet.

18. The high fidelity microphone of claim 1 wherein the microphone housing has a form factor on the order of:
   a. one foot long;
   b. a few inches wide.

19. The high fidelity microphone of claim 1 wherein the internal pre amp circuit comprises one of a tube component topology, an IC topology, or a discrete solid state device topology.

20. The high fidelity microphone of claim 1 in combination with one or more additional said high fidelity microphones for a given audio event including:
   a. live performance amplification; or
   b. recording via an analog or digital recording component.

* * * * *